United States Patent
Takahashi et al.

(10) Patent No.: US 7,843,044 B2
(45) Date of Patent: Nov. 30, 2010

(54) SEMICONDUCTOR DEVICE

(75) Inventors: Hiroyuki Takahashi, Tokyo (JP); Masashi Koyano, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 450 days.

(21) Appl. No.: 11/434,884

(22) Filed: May 17, 2006

(65) Prior Publication Data

US 2006/0263988 A1    Nov. 23, 2006

(30) Foreign Application Priority Data

May 17, 2005    (JP)    ............................. 2005-144076

(51) Int. Cl.
*H01L 23/495*    (2006.01)
(52) U.S. Cl. ................................. 257/673; 257/E23.043
(58) Field of Classification Search ........................ None
See application file for complete search history.

(56) References Cited

U.S. PATENT DOCUMENTS

| | | | | |
|---|---|---|---|---|
| 6,249,041 B1 * | 6/2001 | Kasem et al. | ................ | 257/666 |
| 6,429,078 B2 * | 8/2002 | Kubo | .......................... | 438/270 |
| 6,479,888 B1 * | 11/2002 | Hirashima et al. | ........... | 257/673 |
| 6,774,466 B1 * | 8/2004 | Kajiwara et al. | ............. | 257/673 |
| 7,285,849 B2 * | 10/2007 | Cruz et al. | ................... | 257/690 |
| 2004/0084776 A1 * | 5/2004 | Fukuda et al. | ............... | 257/758 |

* cited by examiner

*Primary Examiner*—Benjamin P Sandvik
(74) *Attorney, Agent, or Firm*—Mattingly & Malur, P.C.

(57) ABSTRACT

Two vertical-type power MISFETs are formed over a semiconductor chip, a common drain electrode formed over a back surface of the semiconductor chip is electrically connected with a drain terminal via a conductive bonding material, source electrodes and gate electrodes formed over a surface of the semiconductor chip are respectively electrically connected with source terminals and gate terminals via bump electrodes, and these components are sealed by a resin sealing portion. The exposed portions of the gate terminals are arranged inside the resin sealing portion, and the exposed portions of the source terminals are arranged outside the resin sealing portion. The source terminals extend over the surface of the semiconductor chip and are connected with the source electrodes which are uniformly arranged over regions of the surface of the semiconductor chip except for gate electrode forming regions and the vicinities of these regions via the bump electrodes.

17 Claims, 22 Drawing Sheets

|  | ON RESISTANCE |
|---|---|
| SEMICONDUCTOR DEVICE 1 OF EMBODIMENT 1 | 7mΩ |
| SEMICONDUCTOR DEVICE 201 OF COMPARISON EXAMPLE | 10mΩ |

US 7,843,044 B2

SEMICONDUCTOR DEVICE

CROSS-REFERENCE TO RELATED APPLICATION

The present application claims priority from Japanese patent application No. 2005-144076 filed on May 17, 2005, the content of which is hereby incorporated by reference into this application.

BACKGROUND OF THE INVENTION

The present invention relates to a semiconductor device, and more particularly to a technique which is effectively applicable to a semiconductor device having field effect transistors which are used as charge/discharge switching elements of a battery or the like.

In a portable equipment as represented by a notebook-type PC or a mobile phone, a Li ion (hereinafter referred to as $Li^+$) battery which possesses high energy density is generally used as a battery which supplies an electric power. A power MISFET is connected with the $Li^+$ battery as a switching element, and the power MISFET controls the $Li^+$ battery by controlling charging and discharging of the battery.

In Japanese Patent Laid-open 2004-356499 (patent document 1), there is disclosed a technique in which a power MOSFET which functions as a protective circuit for a $Li^+$ battery pack formed on a semiconductor chip adopts a pad arrangement in which a source pad, a gate pad, gate pad and a source pad are arranged in order from one direction, and also adopts a pin arrangement in conformity with such pad arrangement in which lead pins of a lead frame are arranged in order in order of a 1 pin, a source pin, a gate pin, a gate pin and a source pin, wherein these pads and pins are connected with each other using wires.

In Japanese Patent Laid-open 2000-307017 (patent document 2), there is disclosed a MOSFET which includes a semiconductor pellet, gate and source inner leads which electrically lead out an MOSFET element to the outside, outer leads which are connected with the inner leads respectively, a header which enhances heat radiation property, and a resin sealing body which seals the semiconductor pellet, a group of inner leads and a portion of the header. Further, the inner leads are mechanically and electrically connected with the semiconductor pellet via connecting portions which are formed of bump, the header which is exposed from the resin sealing body is connected with a side opposite to the semiconductor pellet via a drain connection portion, and the outer leads are bent in a gull-wing shape.

[Patent Literature 1] Japanese Patent Laid-Open 2004-356499

[Patent Literature 2] Japanese patent laid-open 2000-307017

SUMMARY OF THE INVENTION

The following has been found as a result of studies carried out by inventors of the present invention.

Recently, with respect to the notebook type PC or the like, along with the increase of the power consumption attributed to a CPU or a GPU, an electric current which is supplied to the PC from a battery is increased. In a power MISFET which is used as a switch for charging or discharging the battery, a loss is generated in accordance with a product of ON resistance and the square of electric current and hence, when the electric current is increased, a heat value is increased. Accordingly, when the ON resistance is large, it is necessary to apply a design which enhances the heat radiation thus bringing about the increase of a manufacturing cost or the large-sizing of the battery as a whole or a battery protective circuit. Accordingly, there has been a demand for further reduction of the ON resistance of the power MISFET. Further, along with the miniaturization of the notebook type PC or the like, a space which the battery occupies has been made small and hence, there has been also a demand for the miniaturization of a semiconductor device which is used as a switching element of the battery.

In a $Li^+$ battery pack, two power MISFETs for charging and discharging which use a common drain are used in a state that these power MISFETs are connected with a $Li^+$ cell ($Li^+$ battery). When two semiconductor packages which seal semiconductor chips on which the power MISFETs are formed with a resin are prepared and used as switching elements of the $Li^+$ battery pack, the $Li^+$ battery pack becomes large-sized. Accordingly, by forming tow power MISFETs on one semiconductor chip, by forming a semiconductor package by sealing the semiconductor chip with resin, and by using the semiconductor package as a switching element of the $Li^+$ battery pack, the switching element may be formed of one semiconductor package thus realizing the miniaturization of the $Li^+$ battery pack.

FIG. 36 is a plan view of an essential part showing a $Li^+$ battery protective circuit which is formed by mounting a semiconductor device 320 constituting a comparison example which inventors of the present invention have studied on a mounting substrate 323.

In the $Li^+$ battery protective circuit shown in FIG. 36, two power MOSFET $Q_{11}$, $Q_{12}$ for charging and discharging are formed on one semiconductor chip 321, the semiconductor chip 321 is mounted on an island 322a of a lead frame 322 and is wrapped by a package. Lead pins 322b of the lead frame 322 are arranged in order of a source terminal $S_1$, a gate terminal $G_1$, a source terminal $S_2$ and a gate terminal $G_2$ from one direction, wherein when two elements are incorporated in one semiconductor chip 321, the above-mentioned terminal arrangement is generally used. Here, the source terminal $S_1$ and the gate terminal $G_1$ are terminals which are electrically connected with the power MOSFET $Q_{11}$, while the source terminal $S_2$ and the gate terminal $G_2$ are terminals which are electrically connected with the power MOSFET $Q_{12}$. Further, in conformity with the above-mentioned terminal arrangement, the pad arrangement of the power MOSFETs $Q_{11}$, $Q_{12}$ and a layout of a wiring pattern 324 on the mounting substrate 323 are determined.

However, in the $Li^+$ battery protective circuit shown in FIG. 36, when the above-mentioned pin arrangement is used, a portion of the wiring pattern 324 to which the source terminal $S_2$ on the mounting substrate 323 is connected is narrowed and hence, the substrate wiring resistant is increased. Along with the increase of the substrate wiring resistance, a wiring loss is increased thus giving rise to a possibility that drawbacks such as the shortening of life time of the $Li^+$ battery pack attributed to the generation of heat may be generated. Further, after pulling out the wiring pattern 324 to which the source terminal $S_2$ is connected, it is necessary to increase a width of the wiring pattern 324 for reducing the substrate wiring resistance thus giving rise to a drawback that an area of the mounting substrate 323 is increased.

FIG. 37 is a planner perspective view of a semiconductor device 201 of another comparison example which inventors of the present invention have studied.

The semiconductor device 201 of the comparison example shown in FIG. 37 includes a semiconductor chip 202, source terminals 203a, 203b, gate terminals 204a, 204b and a drain terminal 205, and a resin sealing portion (not shown in the drawing) which seals these components. On the semiconductor chip 202, two power MISFETs consisting of first and second power MISFETs are formed.

On a surface of the semiconductor chip 202, as pad electrodes, a source electrode 213a which is electrically connected with a source of the first power MISFET, a gate electrode 214a which is electrically connected with a gate of the first power MISFET, a gate electrode 214b which is electrically connected with a gate of the second power MISFET, and a source electrode 213b which is electrically connected with a source of the second power MISFET. The source electrodes 213a, 213b and the gate electrodes 214a, 214b of the semiconductor chip 202 are respectively electrically connected with the source terminals 203a, 203b and the gate terminals 204a, 204b via bonding wires 207. Further, on a whole back surface of the semiconductor chip 202, a common drain electrode (not shown in the drawing) which is electrically connected with drains of the first and second power MISFETs is formed, and the drain electrode is electrically connected with a drain terminal 205 via a conductive bonding material.

In the semiconductor device 201 of the comparison example having such a constitution, the source electrode 213a, the gate electrode 214a, the gate electrode 214b and the source electrode 213 are arranged in order from one direction, wherein the source electrodes 213a, 213b of the semiconductor chip 202 are arranged outside and the gate electrodes 214a, 214b are arranged inside. Due to such an arrangement, as external terminals, the source terminals 203a, 203b may be arranged outside and the gate terminals 204a, 204b may be arranged inside. Accordingly, in a mounting substrate on which the semiconductor device 201 of the comparison example is mounted, a source wiring pattern which connects the source terminals 203a, 203b is arranged outside a gate wiring pattern which connects the gate terminals 204a, 204b and hence, the degree of freedom of a layout of the wiring pattern is increased whereby the source wiring pattern may be formed with a large width. Accordingly, the substrate wiring resistance of the source wiring pattern is reduced and hence, the wiring loss may be reduced. Further, the layout of the wiring pattern on the mounting substrate on which the semiconductor device 201 is mounted may be simplified and hence, the layout of the wiring pattern may be performed with the small area whereby an area of the mounting substrate may be made small. Accordingly, drawbacks which has been explained with respect to the above-mentioned case in conjunction with FIG. 36 may be overcome.

In the semiconductor device 201 of the comparison example, the source resistance may be reduced by increasing the number of bonding wires 207 which connect the source electrodes 213a, 213b and the source terminals 203a, 203b of the semiconductor chip 202. However, in regions 221, 222, 223, 224 shown in FIG. 37, the source electrodes 213a, 213b are not formed. Even when the source electrodes 213a, 213b are formed such that the source electrodes 213a, 213b also extend to the regions 221, 222, 223, 224, a length of bonding wires which connect the regions 221, 222, 223, 224 and the source terminals 203a, 203b is elongated and hence, the bonding wires which connect the regions 221, 222, 223, 224 and the source terminals 203a, 203b hardly contribute to the reduction of the source resistance. Further, the number of bonding wires 207 which are connectable to the source terminals 203a, 203b is determined based on an area which allows the bonding of the source terminals 203a, 203b and hence, as shown in FIG. 37, for reducing the source resistance, it is advantageous to connect the source electrodes 213a, 213b which are positioned close to the source terminals 203a, 203b with the source terminals 203a, 203b using all bonding wires 207.

Further, when the source electrodes 213a, 213b are formed such that the source electrodes 213a, 213b extend to the regions 222, 224 and the regions 222, 224 and the source terminals 203a, 203b are connected with each other via the bonding wires, there exists a possibility that such bonding wires cross and are brought into contact with bonding wires which connect the gate electrodes 214a, 214b and the gate terminals 204a, 204b. This phenomenon lowers a manufacturing yield rate of the semiconductor device.

Accordingly, as in the case of the semiconductor device 201 of the comparison example, the source terminals 203a, 203b are connected only to the source electrodes 213a, 213b which are positioned close to the source terminals 203a, 203b via the bonding wires 207. Accordingly, in the semiconductor device 201 of the comparison example, the regions 221, 222, 223, 224 on the surface of the semiconductor chip 202 can not be effectively used and the regions 221, 222, 223, 224 define dead spaces and hence, there exists a limit with respect to the reduction of the source resistance and the reduction of the ON resistance. Accordingly, there has been a demand for a technique which can further reduce the source resistance or the ON resistance thus further enhancing the performance and the reliability of the semiconductor device.

It is an object of the present invention to provide a technique which can reduce the ON resistance of the semiconductor device.

It is another object of the present invention to provide a technique which can enhance the performance of the semiconductor device.

The above-mentioned and other objects and novel features of the present invention will become apparent from the description of this specification and attached drawings.

To briefly explain the summary of typical inventions among inventions described in this specification, they are as follows.

The present invention is directed to a semiconductor device which includes a semiconductor chip which forms first and second source electrodes which are respectively electrically connected with sources of first and second field effect transistors and first and second gate electrodes which are respectively electrically connected with gates of the first and second field effect transistors on a front surface thereof and forms a drain electrode which is electrically connected with drains of the first and second field effect transistors on a back surface thereof, first and second source conductor portions which are electrically connected with the first and second source electrodes, first and second gate conductor portions which are electrically connected with the first and second gate electrodes, and a sealing portion which seals at least portions of these components, wherein an exposed portion of the first source conductor portion from the sealing portion, an exposed portion of the first gate conductor portion from the sealing portion, an exposed portion of the second gate conductive portion from the sealing portion and an exposed portion of the second source conductor portion from the sealing portion are arranged in order from one direction, a portion of the first source conductor portion which extends on the front surface of the semiconductor chip is also present in the extending direction which extends toward a portion in the inside of the sealing portion from a portion of the first gate conductor portion from the sealing portion, and a portion of the second source conductor portion which extends on the front surface of the semiconductor chip is also present in the extending direction which extends toward a portion in the inside of the sealing portion from a portion of the second gate conductor portion exposed from the sealing portion.

The present invention is also directed to a semiconductor device which includes: a semiconductor chip in which first and second source electrodes respectively electrically connected with sources of first and second field effect transistors and first and second gate electrodes respectively electrically connected with gates of the first and second field effect transistors are formed on a front surface thereof and in which drain electrodes electrically connected with drains of the first and second field effect transistors are formed on a back surface thereof; first and second source conductor portions which are electrically connected with the first and second source electrodes; first and second gate conductor portions which are electrically connected with the first and second gate electrodes; and a sealing portion which seals at least portions of the components, wherein an exposed portion of the first source conductor portion from the sealing portion, an exposed portion of the first gate conductor portion from the sealing portion, an exposed portion of the second gate conductive portion from the sealing portion and an exposed portion of the second source conductor portion from the sealing portion are arranged in order from one direction, a portion of the first source conductor portion which extends on the front surface of the semiconductor chip has sides which respectively face in an opposed manner two neighboring sides of a portion of the first gate conductor portion on the front surface of the semiconductor chip, and a portion of the second source conductor portion which extends on the front surface of the semiconductor chip has sides which respectively face in an opposed manner two neighboring sides of a portion of the second gate conductor portion on the front surface of the semiconductor chip.

To briefly explain advantageous effects obtained by typical inventions among the inventions disclosed in this specification, they are as follows.

The present invention can reduce the ON resistance of the semiconductor device.

Further, the present invention also can enhance the performance of the semiconductor device.

DESCRIPTION OF THE PREFERRED EMBODIMENTS

Figure 1:
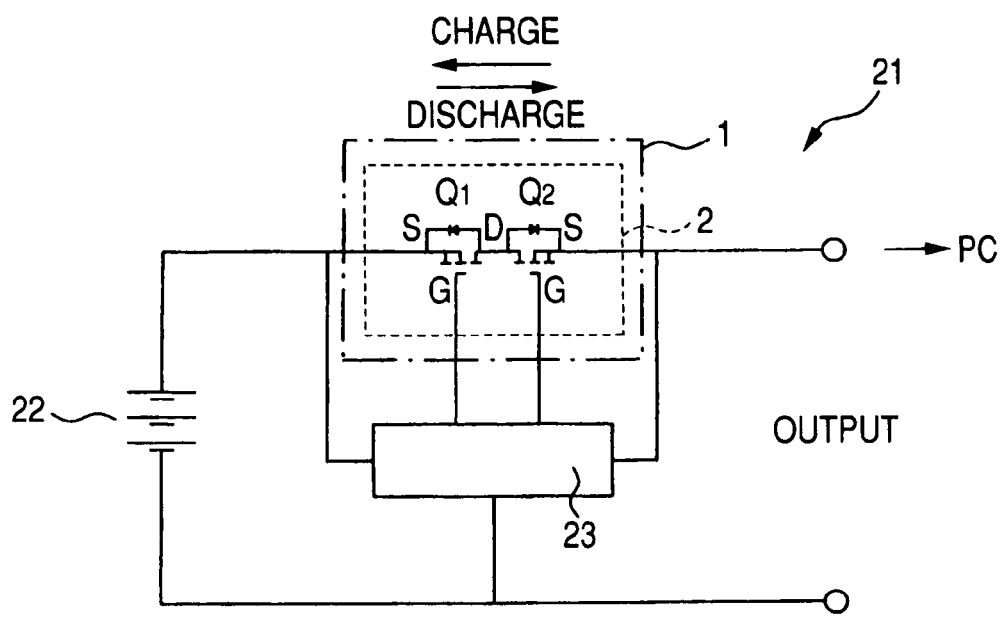
FIG. 1 is a circuit diagram showing a Li+ battery pack using a semiconductor device according to the first embodiment of the present invention.

In the embodiments described hereinafter, when it is necessary for the convenience sake, the invention is explained by dividing the invention into a plurality of sections or embodiments. However, unless otherwise explicitly described, these sections or embodiments are not irrelevant to each other, wherein there exists a relationship that one section or embodiment is a modification, a detail, a complementary explanation of a portion or the whole of other section or embodiment. Further, in the embodiments described hereinafter, when the number of elements and the like (including pieces, numerical values, quantity, range and the like) are referred to, unless otherwise particularly specified or the number is apparently limited to a specified number in principle, the number is not limited to the specified number and may be set to a value which is larger or lower than the specified number. Further, in the embodiment described hereinafter, it is needless to say that the constitutional features (including element steps and the like) are not always indispensable unless otherwise specified or unless they are considered indefinitely indispensable in principle. In the same manner, in the embodiments described hereinafter, when the reference is made with respect to the shape, the positional relationship and the like of the constitutional features, unless otherwise specified or unless it is indefinitely considered unreasonable in view of the principle, these shapes and positional relationship substantially include those which approximate or are similar to these shapes. The same goes for the above-mentioned numerical values and ranges.

Embodiments of the present invention are explained in detail hereinafter in conjunction with drawings. Here, in all drawings for explaining the embodiments, members having the same functions are predetermined same symbols and the repeated explanation of the members is omitted. Further, in the following embodiments, the identical or similar parts is not repeatedly explained in principle unless otherwise necessary.

Further, in the drawings which are used in the embodiments, even when hatching is necessary in the cross-sectional view, the hatching may be omitted for facilitating the understanding of the drawings. Further, hatching may be provided also to a plan view for facilitating the understanding of the drawings.

Embodiment 1

The semiconductor device according to the embodiments of the present invention will be explained with reference to the drawings.

Figure 2:
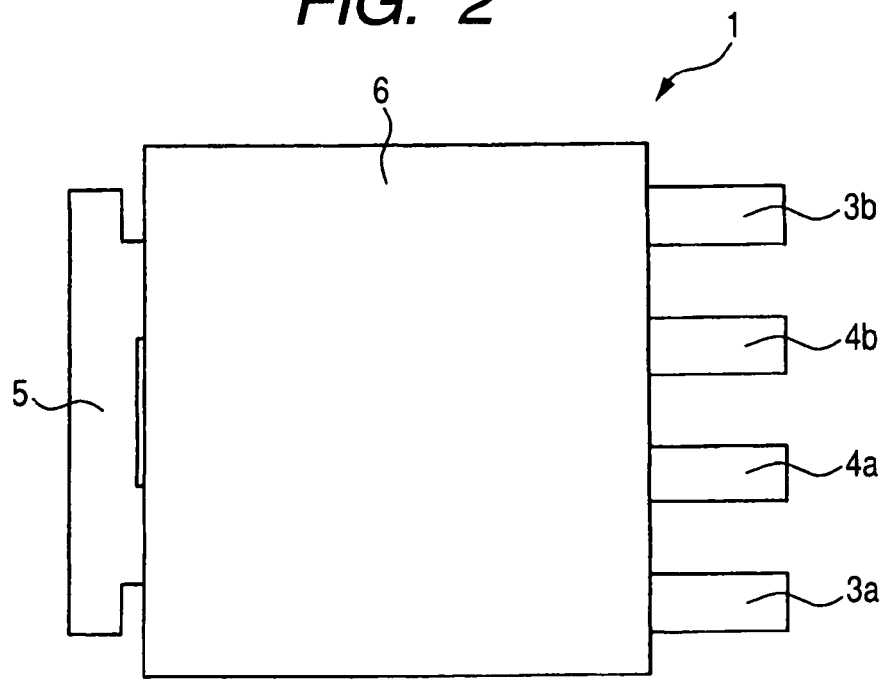
FIG. 2 is a top plan view showing the semiconductor device according to the first embodiment of the present invention.
Figure 3:
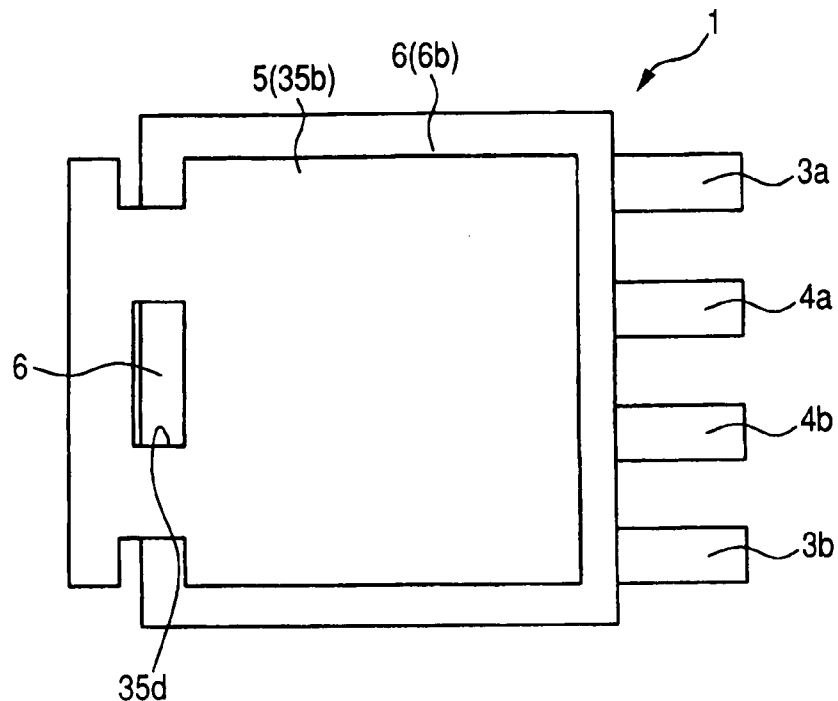
FIG. 3 is a bottom plan view showing the semiconductor device according to the first embodiment of the present invention.
Figure 4:
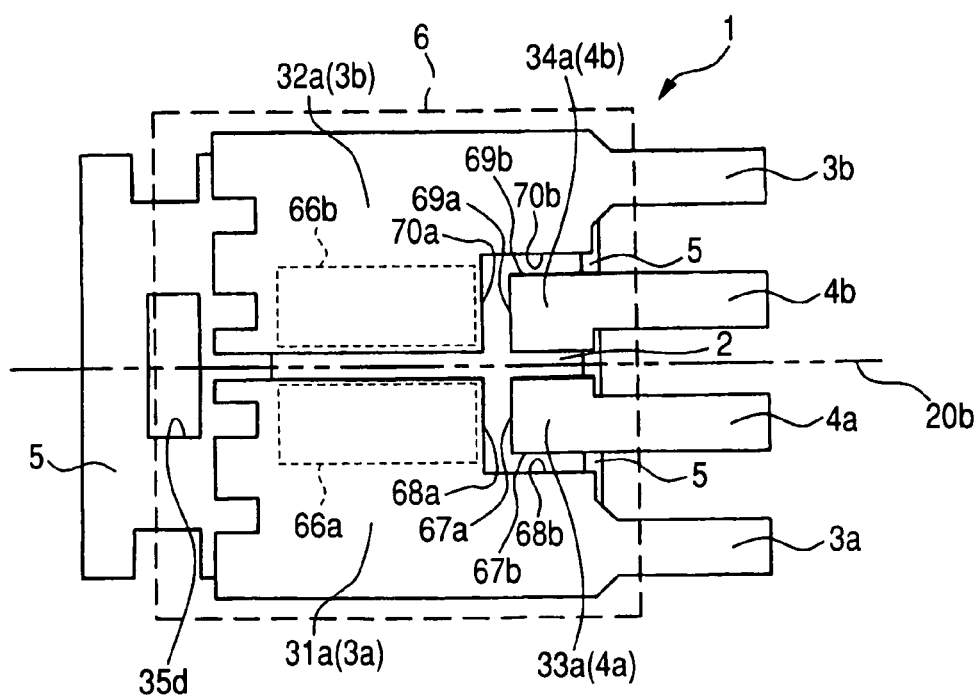
FIG. 4 is a perspective plan view showing the semiconductor device according to the first embodiment of the present invention.
Figure 5:
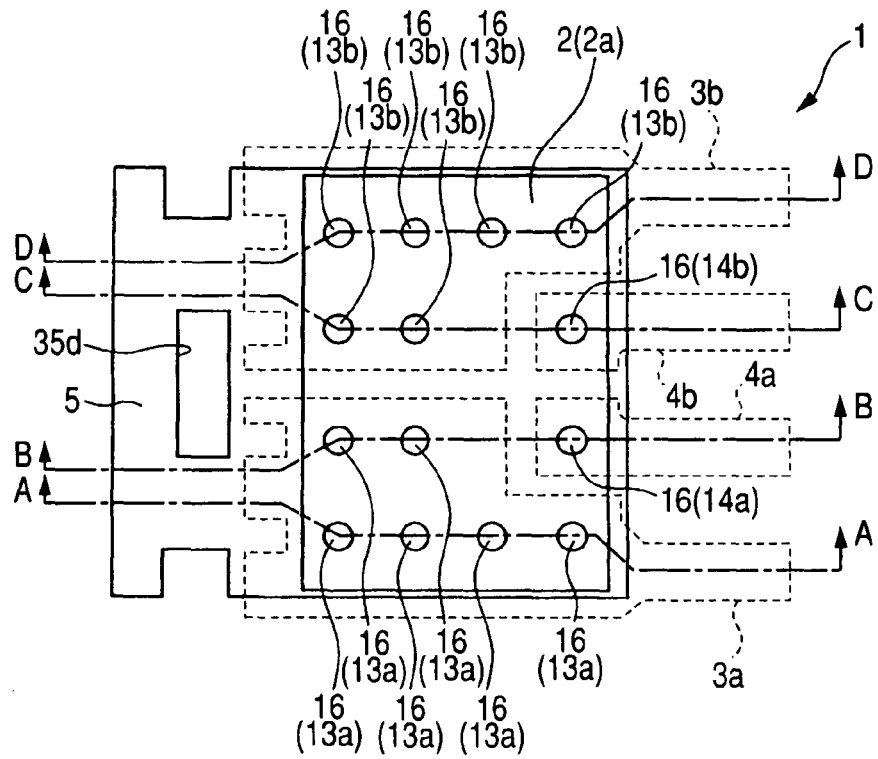
FIG. 5 is a perspective plan view showing the semiconductor device according to the first embodiment of the present invention.

FIG. 1 is a circuit diagram of a $Li^+$ battery pack using a semiconductor device 1 according to an embodiment of the present invention. FIG. 2 is a top plan view (a plan view) of the semiconductor device 1 according to the embodiment of the present invention, FIG. 3 is a bottom plan view (a back view) of the semiconductor device 1, FIG. 4 and FIG. 5 are perspective plan views of the semiconductor device 1, and FIG. 6 to FIG. 9 are cross-sectional views (cross-sectional side views) of the semiconductor device 1. Here, FIG. 4 corresponds to the top plan view of the semiconductor device 1 when a resin sealing portion 6 is observed in a see-through manner, and FIG. 5 corresponds to the top plan view of the semiconductor device 1 when the resin sealing portion 6, source terminals 3a and 3b, and gate terminals 4a and 4b are observed in a see-through manner. Further, a cross section of the semiconductor device 1 at a position taken along a A-A line in FIG. 5 corresponds to FIG. 6, a cross section of the semiconductor device 1 at a position taken along a B-B line in FIG. 5 corresponds to FIG. 7, a cross section of the semiconductor device 1 at a position taken along a C-C line in FIG. 5 corresponds to FIG. 8, and a cross section of the semiconductor device 1 at a position taken along a D-D line in FIG. 5 corresponds to FIG. 9.

As shown in FIG. 1, in a $L^+$ battery pack ($Li^+$ battery pack) 21, two power MISFET $Q_1$ and $Q_2$ (first and second field effect transistors) for charging and discharging which have a common drain D are connected with a $Li^+$ cell ($Li^+$ battery) 22. The power MISFETs $Q_1$ and $Q_2$ are formed in one semiconductor chip 2 and are covered by one semiconductor package (that is, the semiconductor device 1). Further, a control IC 23 is connected with the power MISFETs $Q_1$ and $Q_2$, wherein these $Li^+$ cell 22, the semiconductor device 1 and the control IC 23 are fixed to a $Li^+$ battery protective circuit mounting substrate (corresponding to a mounting substrate 51 described later). Here, in FIG. 1, symbol S indicates sources of the power MISFETs $Q_1$ and $Q_2$, symbol G indicates gates of the power MISFETs $Q_1$ and $Q_2$, and symbol D indicates drains of the power MISFETs $Q_1$ and $Q_2$.

At a time of charging or discharging the $Li^+$ cell 22, the two power MISFETs $Q_1$ and $Q_2$ assume an ON state, while at a time in which neither charging nor discharging is applied to the Li+ cell 22, either one or both of the two power MISFETs $Q_1$ and $Q_2$ assume an OFF state. Such a control of the power MISFETs $Q_1$ and $Q_2$ are performed by the control IC 23. In this manner, by using two power MISFETs $Q_1$ and $Q_2$ as switch elements (switching elements), charging and discharging of the $Li^+$ battery may be controlled thus enabling a control of the $Li^+$ battery.

As shown in FIG. 2 to FIG. 9, the semiconductor device 1 according to this embodiment includes, a semiconductor chip (semiconductor substrate) 2, source terminals 3a, 3b (first and second source conductor portions) which are formed of conductors, gate terminals 4a, 4b (first and second gate conductor portions) and a drain terminal 5 (drain conductor portion), and a resin sealing portion (sealing portion, resin sealing) 6 which seals these components.

The resin sealing portion 6 is made of a resin material or the like, for example, such as a thermosetting resin material or the like, and the resin sealing portion 6 is allowed to include filler and the like the rein. For example, the resin sealing portion 6 may be formed using a filler-contained epoxy resin and the like. With the use of the resin sealing portion 6, the source terminals 3a, 3b, gate terminals 4a, 4b, a portion of the drain terminal 5 and the semiconductor chip 2 are sealed and protected by resin. The resin sealing portion 6 includes two main surfaces formed of an upper surface (surface, first surface) 6a and a back surface (bottom surface, lower surface, second surface) 6b which are arranged in sides opposite to with each other. Here, the back surface 6b of the resin sealing portion 6, that is, the back surface (bottom surface, lower surface) 1b of the semiconductor device 1 is a mounting surface of the semiconductor device 1.

With respect to the semiconductor chip (semiconductor substrate) 2, for example, after the various semiconductor elements or semiconductor integrated circuit are formed on the semiconductor substrate (semiconductor wafer) which is made of single crystal silicon and the like, a back surface grinding of the semiconductor substrate is carried out when necessary and, thereafter, the semiconductor substrate is cut and is separated into the respective semiconductor chips 2 by dicing or the like. The semiconductor chip 2 is sealed in the inside of the resin sealing portion 6.

In this embodiment, as the semiconductor chip 2, a semiconductor chip on which a vertical-type power MISFET (Metal Insulator Semiconductor Field effect Transistor) having a trench-type gate structure is formed or the like may be used. On the semiconductor chip 2, two vertical-type power MISFETs (field effect transistors) corresponding to the power MISFETs $Q_1$, $Q_2$ shown in FIG. 1 are formed.

Figure 10:
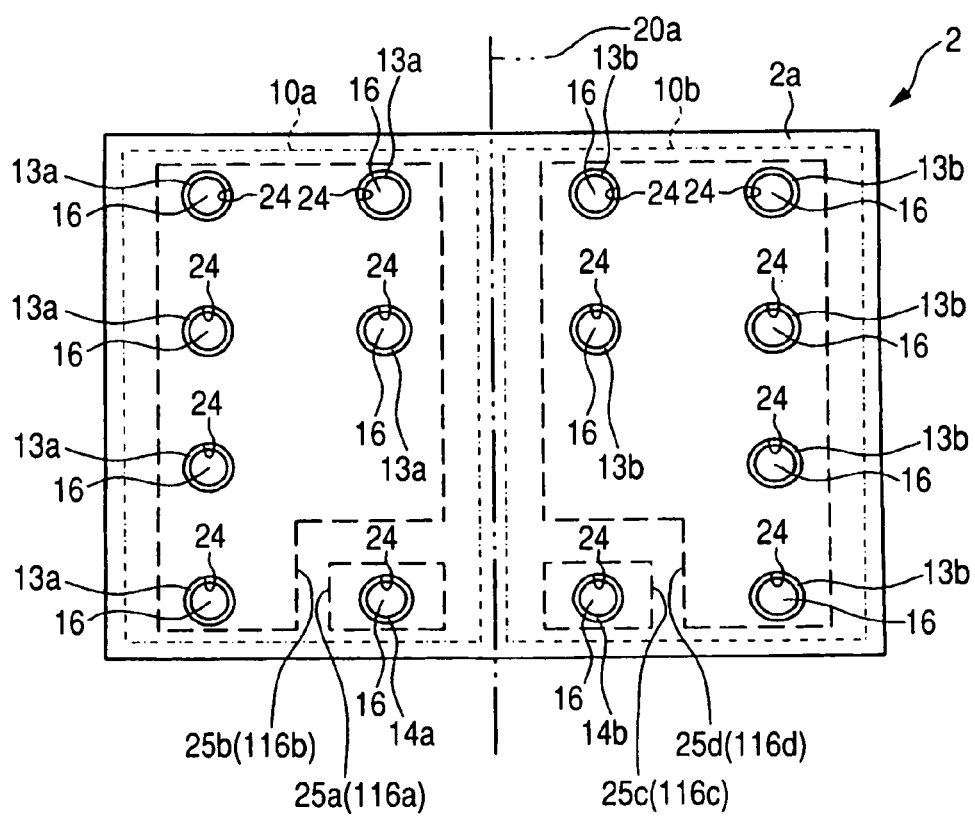
FIG. 10 is a plan view showing a layout of a semiconductor chip which is used for the semiconductor device according to the first embodiment of the present invention.

FIG. 10 is a plan view (top surface view) showing a chip layout of the semiconductor chip 2. Here, in FIG. 10, the semiconductor chip 2 is illustrated in a state that the semiconductor chip 2 shown in FIG. 5 is rotated in the clockwise direction by 90°. The semiconductor chip 2 of this embodiment includes a first MISFET region 10a on which the vertical-type power MISFET (first field effect transistor) corresponding to the power MISFET $Q_1$ shown in FIG. 1 is formed and a second MISFET region 10b on which the vertical-type power MISFET (second field effect transistor) corresponding to the power MISFET $Q_2$ shown in FIG. 1 is formed. The vertical-type power MISFET which is formed on the first MISFET region 10a and the vertical-type power MISFET which is formed on the second MISFET region 10b are arranged on both sides of the semiconductor chip 2 in parallel and are electrically separated from each other by a die separating insulation film or the like.

The semiconductor chip 2 includes two main surfaces which constitute a surface (main surface on a side where the semiconductor element is formed) 2a and a back surface (main surface on a side opposite to the surface 2a) 2b. As shown in FIG. 10, on the surface 2a of the semiconductor chip 2, a source electrode 13a (first source electrode) which is electrically connected with the source of the power MISFET ($Q_1$) which is formed on the first MISFET region 10a and a source electrode 13b (second source electrode) which is electrically connected with the source of the power MISFET ($Q_2$) which is formed on the second MISFET region 10b are formed. Further, on the surface 2a of the semiconductor chip 2, a gate electrode 14a (first gate electrode) which is electrically connected with the gate of the power MISFET ($Q_1$) formed in the first MISFET region 10a and a gate electrode 14b (second gate electrode) which is electrically connected with the gate of the power MISFET ($Q_2$) formed in the second MISFET region 10b are formed. Further, on the whole surface of the back surface 2b of the semiconductor chip 2, a drain electrode 15 which is electrically connected with a drain of the power MISFET ($Q_1$) formed on the first MISFET region 10a and a drain of the power MISFET ($Q_2$) formed on the second MISFET region 10b is formed.

The source electrodes 13a, 13b and the gate electrodes 14a, 14b are formed of conductor films (conductor film pattern) 25a, 25b, 25c, 25d which are exposed from an opening portion 24 formed on a surface protective film (insulation film 117 described later) of the semiconductor chip 2. The conductor films 25a, 25b 25c, 25d are formed of a conductor film (corresponding to aluminum film 116 described later) which exists on the same layer below the face protective film. In FIG. 10, pattern shapes of the conductor film 25a which forms the gate electrode 14a, the conductor film 25b which forms the source electrode 13a, the conductor film 25c which forms the gate electrode 14b and the conductor film 25d which forms the source electrode 13b are indicated by broken lines. The conductor film 25a and the conductor film 25b are respectively and electrically connected with the gate and source of the power MISFET ($Q_1$) which is formed in the first MISFET region 10a, and the conductor film 25c and the conductor film 25d are respectively and electrically connected with the gate and the source of the power MISFET ($Q_2$) which is formed in the second MISFET region 10b.

As also shown in FIG. 10, in the first MISFET region 10a, a plurality of opening portions 24 are formed in the same (common) conductor film 25b, and a plurality of source electrodes 13a are formed of the conductor film 25b which exposes from the plurality of opening portions 24. Further, in the second MISFET region 10b, the plurality of opening portions 24 are formed in the same (common) conductor film 25d, and a plurality of source electrodes 13b are formed of the conductor film 25d which exposes from the plurality of opening portions 24. Accordingly, on the surface 2a of the semiconductor chip 2, the plurality of source electrodes 13a, 13b are respectively formed, the plurality of source electrodes 13a are arranged in the first MISFET region 10a of the semiconductor chip 2 and the plurality of source electrodes 13b are arranged in the second MISFET region 10b of the semiconductor chip 2. Further, on the surface 2a of the semiconductor chip 2, one gate electrode 14a and one gate electrode 14b are respectively formed, and one gate electrode 14a is arranged on the first MISFET region 10a of the semiconductor chip 2 and one gate electrode 14b is arranged in the second MISFET region 10b of the semiconductor chip 2. On the respective source electrodes 13a, 13b and the respective gate electrodes 14a, 14b, the bump electrodes (projecting electrode) 16 are formed. The bump electrodes 16 are, for example, made of a gold (Au) bump. As another kind of the bump electrode, the bump electrode 16 may be also made of a solder bump. Further, one drain electrode 15 is formed on the whole surface of the back surface 2b of the semiconductor chip 2. The drain of the power MISFET ($Q_1$) which is formed in the first MISFET region 10a and the drain of the power MISFET ($Q_2$) which is formed on the second MISFET region 10b become the common potential which is supplied to the drain electrode 15.

On the surface 2a of the semiconductor chip 2, arrangements (arrays) of the source electrode 13a and the gate electrode 14a and arrangements (arrays) of the source electrode 13b and the gate electrode 14b assume a line symmetrical relationship with respect to a line 20a which passes between the first MISFET region 10a and the second MISFET region 10b. That is, an array of the bump electrode 16 in the first MISFET region 10a and an array of the bump electrode 16 in the second MISFET region 10b assume an a line symmetrical relationship with respect to a line 20a which passes between the first MISFET region 10a and the second MISFET region 10b. The line 20a corresponds to a line which divides the semiconductor chip 2 in two.

All of the source terminals 3a, 3b, the gate terminals 4a, 4b and the drain terminal 5 are made of a conductor, for example, these terminals are made of the conductive material which is mainly made of copper (Cu) or copper alloy and the like. When the source terminals 3a, 3b, the gate terminals 4a, 4b and the drain terminal 5 are formed of the conductive material which is mainly made of copper, it is possible to achieve a reduction in resistance and a reduction of cost of the source terminals 3a, 3b, the gate terminals 4a, 4b and the drain terminal 5. For example, by processing a conductor plate such as a copper plate, the source terminals 3a, 3b, the gate terminals 4a, 4b and the drain terminal 5 may be formed. The semiconductor chip 2 is arranged between the drain terminal 5 which is positioned at the back surface 2b side of the semiconductor chip 2 and the source terminals 3a, 3b, gate terminals 4a, 4b which are positioned at the surface 2a side of the semiconductor chip 2. Here, the portions between the source terminal 3a, the source terminal 3b, the gate terminal 4a, the gate terminal 4b and the drain terminal 5 are respectively insulated by the resin sealing portion 6.

The semiconductor device 1 includes two source terminals 3a, 3b (source terminals, source leads, a source conductive plate and a source conductor portion). The respective source terminals 3a, 3b have portions thereof exposed from a side surface of the resin sealing portion 6 in the projecting manner and have another portions (portions 31a, 32a) thereof sealed in the inside of the resin sealing portion 6, and extend on the surface 2a of the semiconductor chip 2. A plurality of source electrodes 13a of the semiconductor chip 2 are bonded to a lower surface 31b of a portion 31a which extends on the surface 2a of the semiconductor chip 2 out of the source terminals 3a via a plurality of bump electrode 16 thus establishing an electrical connection therebetween. A plurality of source electrodes 13b of the semiconductor chip 2 are bonded to a lower surface 32b of a portion 32a which extends on the surface 2a of the semiconductor chip 2 out of the source terminals 3b via a plurality of bump electrodes 16 thus establishing an electrical connection therebetween.

Further, the semiconductor device 1 includes two gate terminals 4a, 4b (gate terminals, gate leads, a gate conductive plate and a gate conductor portion). The respective gate terminals 4a, 4b have portions thereof exposed from a side surface of the resin sealing portion 6 in a projecting manner and have another portions (portions 33a, 34a) thereof sealed in the inside of the resin sealing portion 6, and extend on the surface 2a of the semiconductor chip 2. The gate electrode 14a of the semiconductor chip 2 is bonded to a lower surface 33b of a portion 33a which extends on the surface 2a of the semiconductor chip 2 out of the gate terminal 4a via the bump electrode 16 thus establishing an electrical connection therebetween. The gate electrode 14b of the semiconductor chip 2 is bonded to a lower surface 34b of a portion 34a which extends on the surface 2a of the semiconductor chip 2 out of the gate terminals 4b via the bump electrode 16 thus establishing an electrical connection therebetween.

Further, the semiconductor device 1 includes one drain terminal (a drain terminal, a drain lead, a drain conductive plate and a drain conductor portion) 5. The drain electrode 15 of the back surface 2b of the semiconductor chip 2 is bonded (adhered) and electrically connected with an upper surface 35a of the drain terminal 5 via a conductive bonding material (adhesive material) 18 such as a silver (Ag) paste, solder or the like. A lower surface 35b (a surface of a side opposite to the upper surface 35a) on the drain terminal 5 is exposed at a back surface 6b of the resin sealing portion 6.

In the semiconductor device 1 of this embodiment, the source terminal 3a, the gate terminal 4a, the gate terminal 4b and the source terminal 3b are arranged in order from one direction. That is, the gate terminals 4a, 4b are arranged inside the semiconductor device 1, and the source terminals 3a, 3b are arranged on both sides of the gate terminals 4a, 4b. As also shown in FIG. 4, in a state that a line symmetry is established with respect to a line 20b which passes between the gate terminal 4a and the gate terminal 4b, the source terminal 3a and the gate terminal 4a are arranged on one side out of both sides of the line 20b with the gate terminal 4a arranged inside, while the gate terminal 4b and the source terminal 3b are arranged on another side of both sides of the line 20b with the gate terminal 4b arranged inside. Further, the source terminal 3a and the source terminal 3b assumes a symmetrical planar arrangement with respect to the line 20b which passes between the gate terminal 4a and the gate terminal 4b. Further, the source terminal 3a and the source terminal 3b assume a line symmetrical planar shape with respect to the line 20b, while the gate terminal 4a and the gate terminal 4b assume a line symmetrical planar shape with respect to the line 20b. The line 20b corresponds to a line which divides the semiconductor device 1 in two, and is a line which is overlapped to the above-mentioned line 20a in plane.

The source terminals 3a, 3b have portions thereof sealed in the inside of the resin sealing portion 6 and have another portions thereof exposed from the side surface of the resin sealing portion 6 in a projecting manner, and the source electrodes 13a, 13b of the semiconductor chip 2 are connected with the portions 31a, 32a which are sealed in the inside of the resin sealing portion 6 and extend on the surface 2a of the semiconductor chip 2 via the bump electrodes 16. The gate terminal 4a, 4b have portions thereof sealed in the inside of the resin sealing portion 6 and have another portions thereof exposed from the side surface of the resin sealing portion 6 in a projecting manner, and the gate electrodes 14a, 14b of the semiconductor chip 2 are connected with the portions 33a, 34a which are sealed in the inside of the resin sealing portion 6 and extend on the surface 2a of the semiconductor chip 2 via the bump electrode 16.

The portion 31a which extends on the surface 2a of the semiconductor chip 2 out of the source terminal 3a also exists in the extending direction from a portion of the gate terminal 4a which is exposed to a portion of the gate terminal 4b in the inside of the resin sealing portion 6 from the resin sealing portion 6, and includes a region in the extending direction (corresponding to a region 66a shown in FIG. 4). That is, the portion 31a which extends on the surface 2a of the semiconductor chip 2 out of the source terminal 3a includes sides (corresponding to a side 68a and a side 68b shown in FIG. 4) which respectively face two neighboring sides (corresponding to a side 67a and a side 67b shown in FIG. 4) of a portion 33a of the gate terminal 4a which extends on the surface 2a of the semiconductor chip 2. Also in the region 66a, the source electrode 13a and the source terminal 3a (portion 31a of the source terminal 3b) extending on the source electrode 13a of the semiconductor chip 2 are bonded to each other through the bump electrode 16 thus establishing an electrical connection therebetween.

Further, the portion 32a which extends on the surface 2a of the semiconductor chip 2 out of the source terminal 3b also exists in the extension direction of a direction to a portion of the gate terminal 4b in the inside of the resin sealing portion 6 from a portion of the gate terminal 4b which is exposed from the resin sealing portion 6, and includes a region of the extension direction (corresponding to a region 66b shown in FIG. 4). That is, the portion 32a which extends on the surface 2a of the semiconductor chip 2 out of the source terminal 3b includes sides (corresponding to a side 70a and a side 70b shown in FIG. 4) which respectively face two neighboring sides (corresponding to a side 69a and a side 69b shown in FIG. 4) of a portion 34a of the gate terminal 4b which extends on the surface 2a of the semiconductor chip 2. In also the region 66b, the source electrode 13b and the source terminal 3b (portion 32a of the source terminal 3b) extending on the source electrode 13b of the semiconductor chip 2 are bonded to each other via the bump electrode 16 thus establishing an electric connection therebetween.

Accordingly, in the semiconductor device 1 of this embodiment, on the surface 2a of the semiconductor chip 2, it is possible to uniformly arrange the bump electrodes 16 which connect the source electrodes 13a, 13b and the source terminals 3a, 3b on the substantially whole region excluding a region where the gate electrodes 14a, 14b exist and the vicinity thereof in a spaced-apart manner. Further, it is possible to connect a plurality of respective bump electrodes 16 to the source terminals 3a, 4a which extend on the region (includes the regions 66a, 66b) excluding a region where the gate electrodes 14a, 14b exist and the vicinity thereof on the surface 2a of the semiconductor chip 2. Accordingly, it is possible to reduce a source resistance and reduce the ON resistance of the semiconductor device 1.

As also shown in FIG. 6 to FIG. 9, the source terminal 3a is bent at a portion (projecting portion) thereof which projects from the resin sealing portion 6, a terminal surface 31d of the source terminal 3a is formed of a lower surface in the vicinity of an end portion 31c of a side of the source terminal 3a which projects from the resin sealing portion 6. Further, the source terminal 3b is bent at a projected position (projecting portion) thereof which projects from the resin sealing portion 6, an terminal surface 32d of the source terminal 3b is formed by a lower surface in the vicinity of an end portion 32c of a side of the source terminal 3b which is exposed from the resin sealing portion 6. Further, the gate terminal 4a is bent at a portion (projecting portion) thereof which projects from the resin sealing portion 6, a terminal surface 33d of the gate terminal 4a is formed by a lower surface in the vicinity of an end portion 33c of a side of the gate terminal 4a which projects from the resin sealing portion 6. Further, the gate terminal 4b is bent at a portion (projecting portion) thereof which projects from the resin sealing portion 6, a terminal surface 34d of the gate terminal 4b is formed by a lower surface in the vicinity of an end portion 34c of a side of the source terminal 4b which projects from the resin sealing portion 6. These terminal surfaces 31d, 32d, 33d, 34d are arranged on the substantially same plane with a lower surface 35b of the drain terminal 5. Here, the end portions 31c, 32c, 33c, 34c of the source terminals 3a, 3b and the gate terminals 4a, 4b are the end portions (end surfaces, side surfaces) which are formed by a cutting process in the manufacture of the semiconductor device 1.

The drain terminal 5 has respective portions of a side surface and the upper surface 35a thereof sealed in the inside of the resin sealing portion 6 and, in the inside of the resin sealing portion 6, the drain electrode 15 of the back surface 2b of the semiconductor chip 2 is connected with the upper surface 35a of the drain terminal 5. Further, the lower surface 35b of the drain terminal 5 is exposed at the back surface 6b of the resin sealing portion 6. In the vicinity of the end portion 35c of the drain terminal 5 which is arranged on a side opposite to a side which is sealed in the inside of the resin sealing portion 6, the drain terminal 5 projects from and is exposed on the side surface of the resin sealing portion 6. Here, the end portion 35c of the drain terminal 5 is the end portion (end surface, side surface) which is formed by cutting process at the manufacturing time of the semiconductor device 1. Further, resin-lock opening portion (slit) 35d is formed in the drain terminal 5 and a resin sealing portion 6 is filled in the inside of the opening portion 35d thus making the drain terminal 5 hardly removed from the resin sealing portion 6. In place of the opening portion 35d, a non-penetration-type resin lock such as a V-shaped groove may be provided.

In this manner, on the back surface (the bottom surface) 1b side of the semiconductor device 1 which corresponds to the back surface 6b of the resin sealing portion 6, the terminal surfaces 31d, 32d, 33d, 34d of the source terminals 3a, 3b and the gate terminals 4a, 4b and the lower surface 35b of the drain terminal 5 are exposed. These exposed portions of the respective terminals (that is, the terminal surfaces 31d, 32d, 33d, 34d of the source terminals 3a, 3b and a gate terminals 4a, 4b and the lower surface 35b of the drain terminal 5) function as external terminals (terminals, external connection terminals) of the semiconductor device. Accordingly, it is preferable that the terminal surfaces 31d, 32d of the source terminals 3a, 3b, the terminal surfaces 33d, 34d of the gate terminals 4a, 4b and the lower surface 35b of the drain terminal 5 which are exposed on the back surface 1b of the semiconductor device 1 are substantially formed on the coplanar plane. Since the terminal surfaces 31d, 32d, 33d, 34d of the source terminals 3a, 3b and the gate terminals 4a, 4b and the lower surface 35b of the drain terminal 5 are exposed on the back surface 1b side of the semiconductor device 1 as the external terminals, the back surface 1b side of the semiconductor device 1 defines the mounting surface of the semiconductor device 1. Further, the drain terminal 5 also functions as a heat radiation member of the semiconductor device 1 and may radiate heat generated by the semiconductor chip 2 to the mounting substrate (corresponding to the mounting substrate 51 described later) side on which the semiconductor device 1 is mounted by way of the drain terminal 5.

Further, in the semiconductor device of this embodiment, as described above, since the source terminal 3a, the gate terminal 4a, the gate terminal 4b and the source terminal 3b are arranged in one direction in order, the exposed portion (the terminal surface 31d of the exposed portion) of the source terminal 3a, the exposed portion (the terminal surface 33d of the exposed portion) of the gate terminal 4a, the exposed portion (the terminal surface 34d of the exposed portion) of the gate terminal 4b and the exposed portion (the terminal surface 32d of the exposed portion) of the source terminal 3b from the resin sealing portion 6 are also arranged (arrayed) in one direction in order. Accordingly, in this embodiment, the exposed portions (the terminal surfaces 33d, 34d of the exposed portions) of the gate terminals 4a, 4b are arranged in the inside, and the exposed portions (the terminal surfaces 31d, 32d of the exposed portions) of the source terminals 3a, 3b are arranged on both sides of the respective exposed portions of the gate terminals 4a, 4b.

Figure 11:
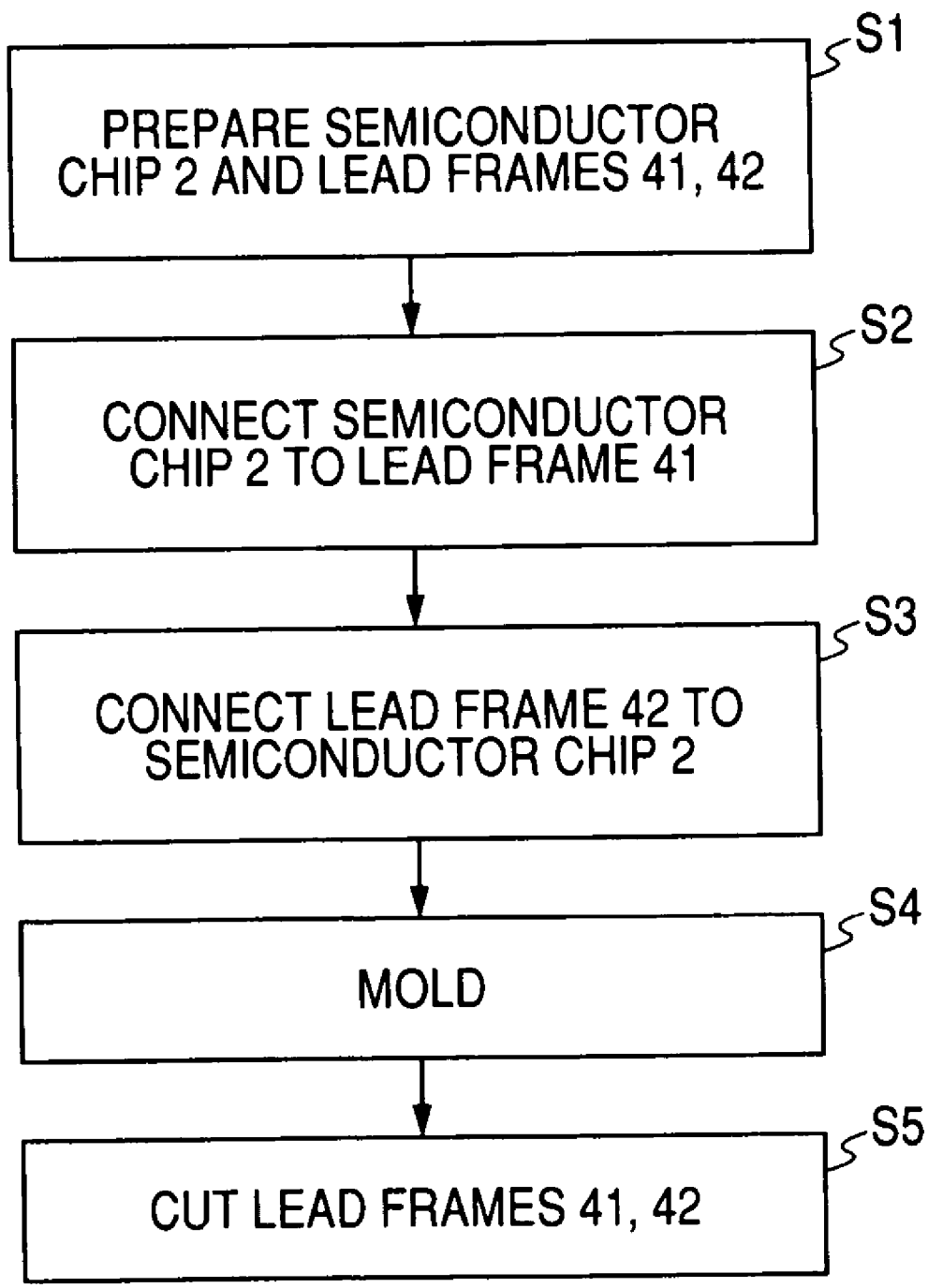
FIG. 11 is a step flow chart showing the manufacturing steps of the semiconductor device according to the first embodiment of the present invention.
Figure 12:
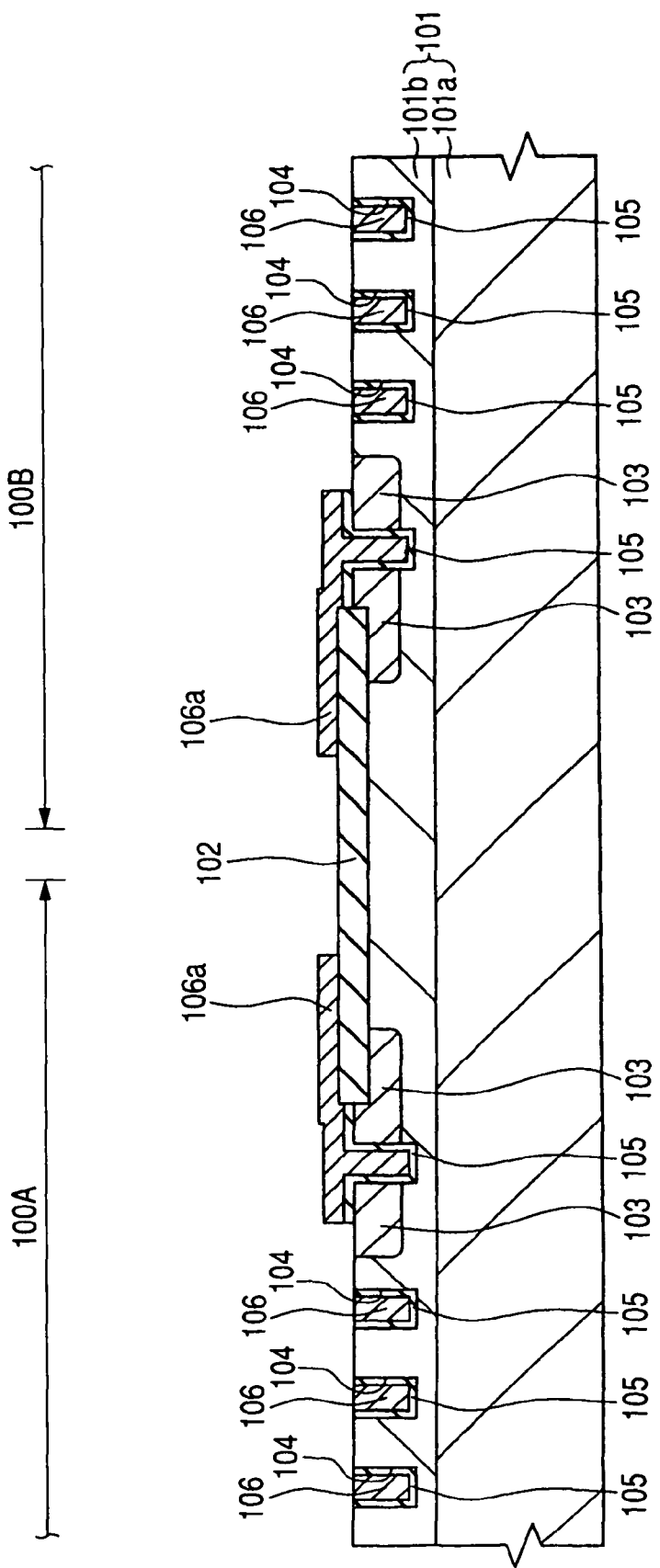
FIG. 12 is a cross-sectional view of an essential part of the semiconductor chip which is used for the semiconductor device in the manufacturing step according to the first embodiment of the present invention.
Figure 13:
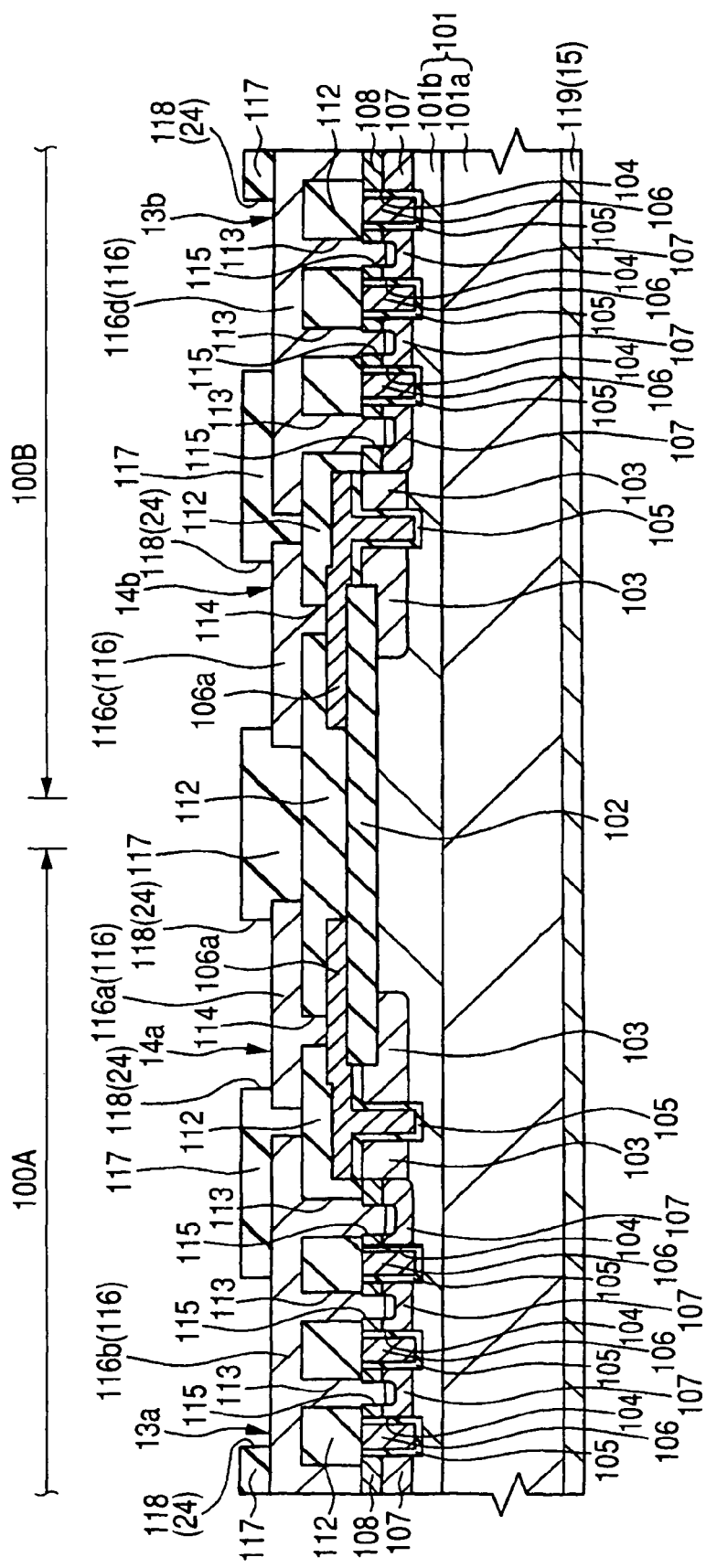
FIG. 13 is a cross-sectional view of an essential part of the semiconductor chip which is used for the semiconductor device in the manufacturing step following the manufacturing step shown in FIG. 12 according to the first embodiment of the present invention.
Figure 14:
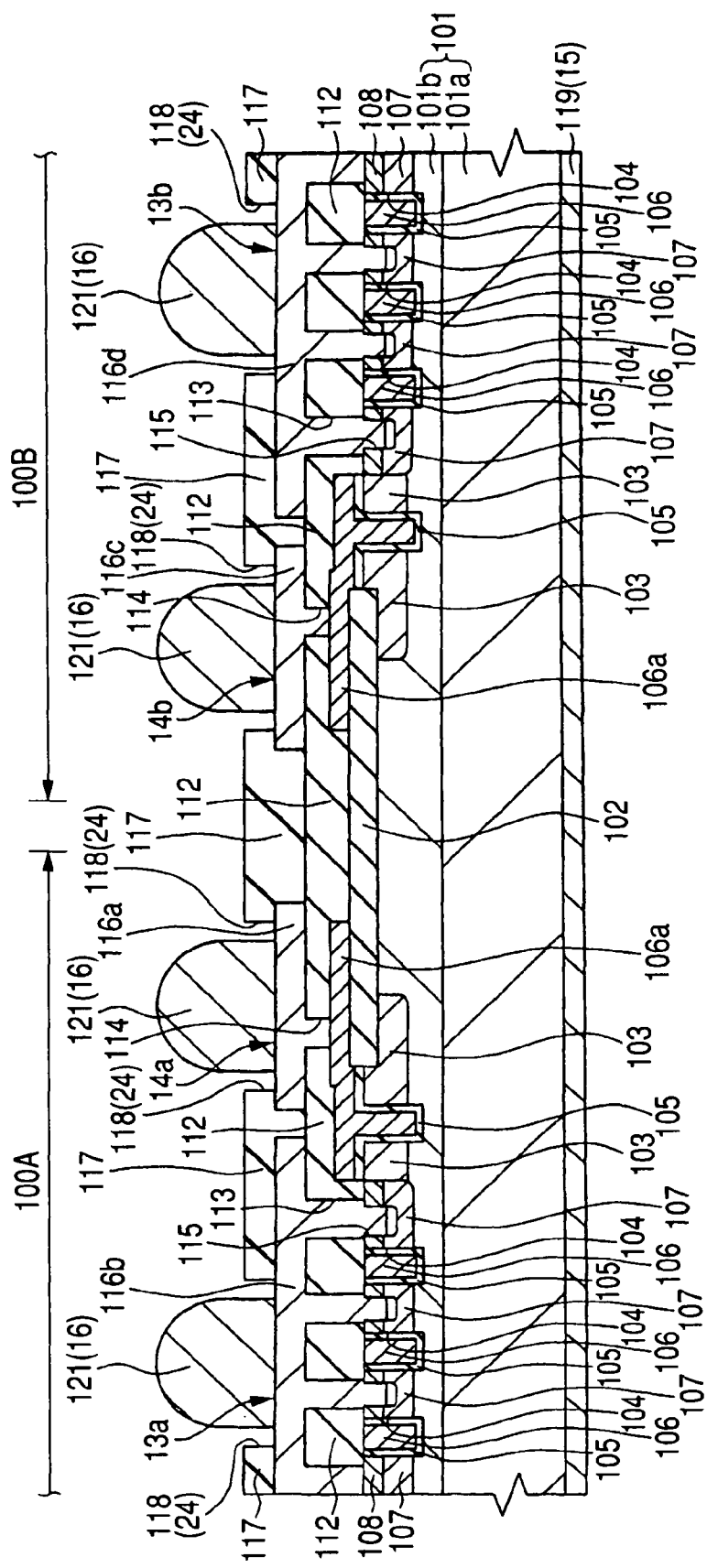
FIG. 14 is a cross-sectional view of an essential part of the semiconductor chip which is used for the semiconductor device in the manufacturing steps following the manufacturing step shown in FIG. 13 according to the first embodiment of the present invention.
Figure 15:
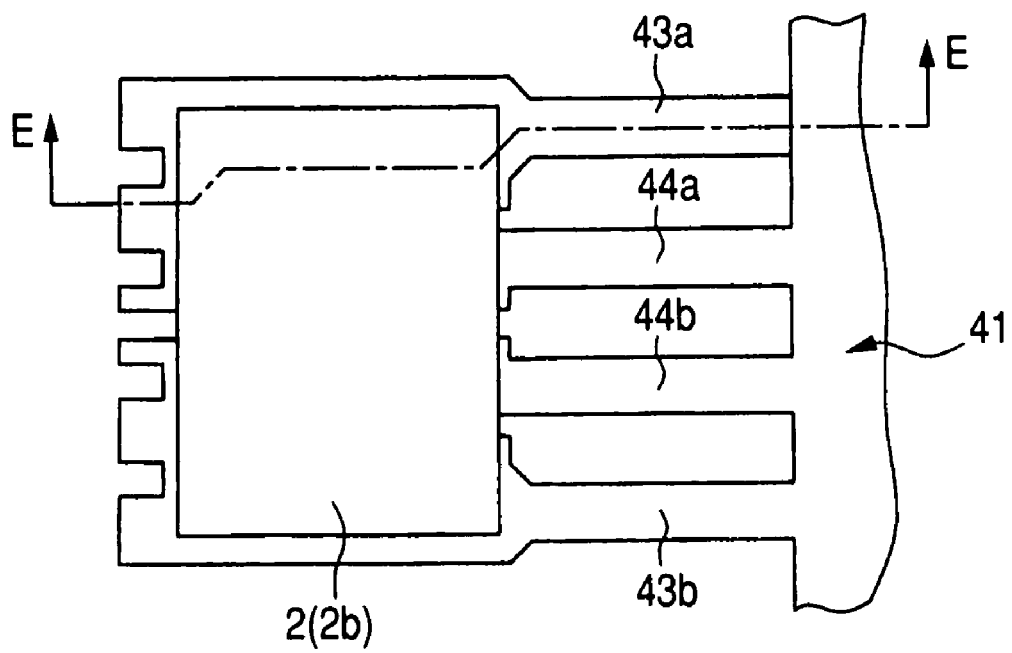
FIG. 15 is a plan view of the semiconductor device in a manufacturing step according to the first embodiment of the present invention.
Figure 16:
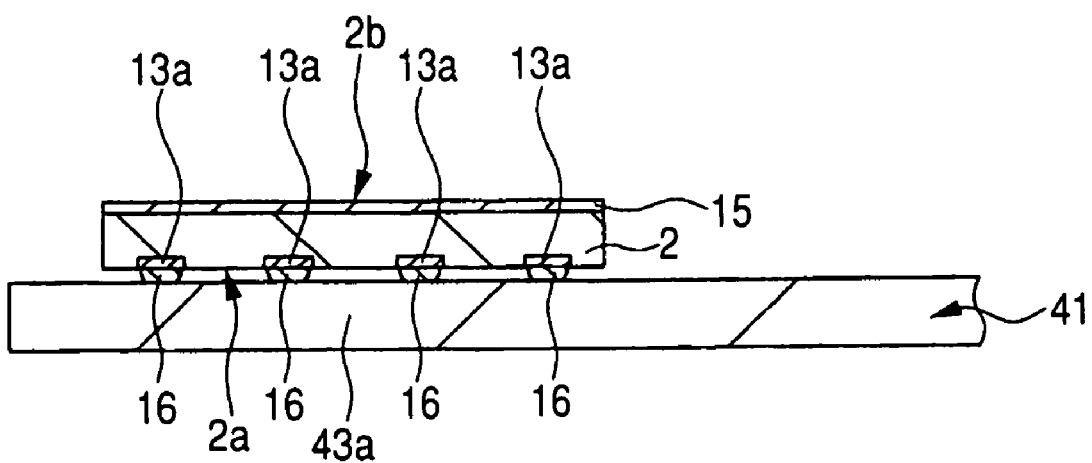
FIG. 16 is a cross-sectional view of the same semiconductor device in the same manufacturing step shown in FIG. 15.
Figure 17:
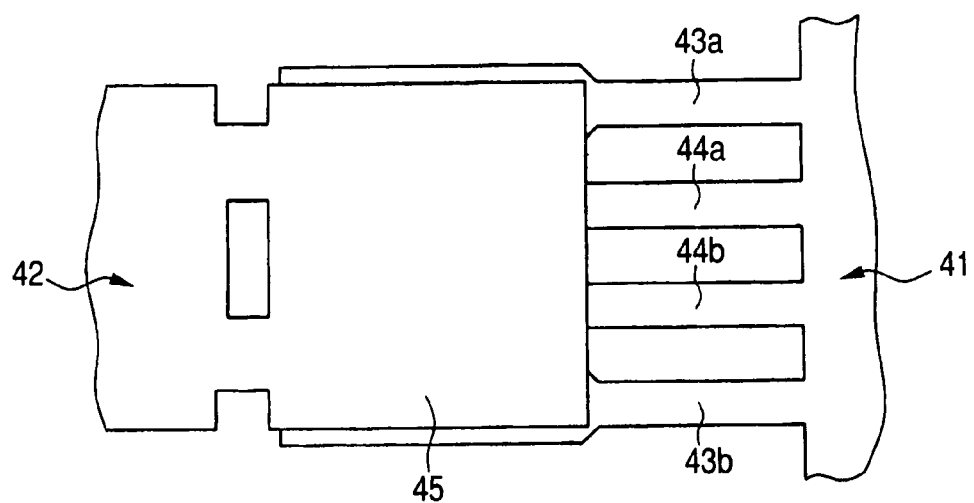
FIG. 17 is a plan view of the semiconductor device in a manufacturing step following the manufacturing step shown in FIG. 15.

Next, manufacturing steps of a semiconductor device 1 of this embodiment are explained. FIG. 11 is a flow chart showing the manufacturing steps of the semiconductor device 1 of this embodiment. FIG. 12 to FIG. 14 are cross-sectional views of an essential part of the semiconductor chip 2 used in this embodiment in the manufacturing steps. FIG. 15 to FIG. 21 are plan views and cross-sectional views of an essential part showing manufacturing steps of the semiconductor device 1 of this embodiment. In these FIG. 15 to FIG. 21, FIG. 15, FIG. 17 and FIG. 19 are plan views (plan views of the essential part), and FIG. 16, FIG. 18, FIG. 20 and FIG. 21 are cross-sectional views (cross-sectional views of the essential part). Here, FIG. 16, FIG. 18, FIG. 20 and FIG. 21 show cross sections at a position taken along a line E-E in FIG. 15. That is, these cross sections correspond to the cross section shown in FIG. 6. Further, FIG. 15 and FIG. 16 correspond to the same step, FIG. 17 and FIG. 18 correspond to the same step, and FIG. 19 and FIG. 20 correspond to the same step. Here, the structures shown in FIG. 15 and FIG. 17 and the structure shown in FIG. 19 have front and back surfaces thereof arranged opposite to each other (FIG. 15 and FIG. 17 are shown in the same direction as FIG. 3, and FIG. 19 is shown in the same direction as FIG. 2).

For manufacturing the semiconductor device 1, first of all, the semiconductor chip 2 and the lead frames (conductor members) 41, 42 are prepared (step S1).

One example of the manufacturing steps of the semiconductor chip 2 is explained using FIG. 12 to FIG. 14.

For manufacturing the semiconductor chip 2, first of all, as shown in FIG. 12, on a main surface of the semiconductor substrate (the semiconductor wafer) 101a which is made of n$^+$-type single crystal silicon in which, for example, arsenic (As) is introduced, an epitaxial layer 101b which is made of n$^-$-type single crystal silicon is grown to form a semiconductor substrate (a semiconductor wafer, a so-called epitaxial wafer) 101.

The semiconductor substrate 101 includes a region 100A on which a vertical-type power MISFET which corresponds to the above-mentioned power MISFETQ$_1$ is formed and a region 100B on which a vertical-type power MISFET which corresponds to the above-mentioned power MISFETQ$_2$ is formed. The region 100A corresponds to the above-mentioned first MISFET region 10a and the region 100B corresponds to the second MISFET region 10b.

Next, after forming an insulation film (a silicon oxide film) on a main surface of the semiconductor substrate 101, an insulation film 102 (SiO$_2$ plate) is formed by patterning or the like the insulation film. The region 100A and the region 100B of the semiconductor substrate 101 are electrically separated from each other by an insulation film 102. Accordingly, it is possible to electrically separate the vertical-type power MISFET which is formed on the region 100A and the vertical-type power MISFET which is formed on the region 100B from each other.

Next, by implanting ions of p-type impurities (for example, boron (B)) into the main surface of the semiconductor substrate 101, a p-type well 103 is formed.

Next, the semiconductor substrate 101 is etched by dry etching using a photoresist pattern (not shown in the drawings) as an etching mask thus forming a groove for forming a trench gate, that is, a gate trench 104. A depth of the gate trench 104 is larger than a depth of the p-type well 103 and smaller than a depth of the bottom portion of the epitaxial layer 101b.

Next, with the use of a thermal oxidation method, for example, a relatively thin gate insulation film (a silicon oxide film) 105 is formed on an inner wall surface (a side surface and a bottom surface) of the gate trench 104 or the like.

Next, on the main surface of the semiconductor substrate 101, a conductive film (a gate electrode material film) formed of, a low-resistance polycrystalline silicon film or the like, for example, is formed. Then, a photo resist pattern (not shown in the drawings) which covers a gate wiring forming region and exposes other regions other than the gate wiring forming region is formed on the above-mentioned conductive film. Here, by etching back the above-mentioned conductive film using the photo resist pattern as an etching mask, a gate portion 106 which is made of low-resistance polycrystalline silicon or the like which is embedded in the inside of the gate trench 104 and a gate wiring portion 106a which is integrally formed with the gate portion 106 are formed.

Next, as shown in FIG. 13, by implanting ions of the p-type impurity (for example, boron (B)) into the main surface of the semiconductor substrate 101, a channel region 107 is formed. Then, by implanting ions of an n-type impurity (for example, arsenic (As)) into the main surface of the semiconductor wafer 1, a source region 108 is formed.

Next, the insulation film 112 is formed on the main surface of the semiconductor substrate 101 and the patterning is applied to the insulation film 112 using a photolithographic technique and an etching technique. Here, a contact hole 113 which exposes the main surface of the semiconductor substrate 101 and a through hole 114 which exposes a portion of the gate wiring portion 106a are formed in the insulation film 112.

Next, by etching the semiconductor substrate 101 which is exposed from the contact hole 113, a hole 115 is formed. Then, on the semiconductor substrate 101 which is exposed from the contact hole 113 and the hole 115, by implanting ions of the p-type impurity, for example, (boron (B), for example), a p$^+$-type semiconductor region is formed.

Next, on the main surface of the semiconductor substrate 101 after forming a titanium tungsten film (not shown in the drawing), when necessary, for example, an aluminum film (or an aluminum alloy film) 116 is formed using a sputtering method or the like. Then, a stacked film of the titanium tungsten film and the aluminum film 116 is patterned using a photolithographic technique and an etching technique. Due to the patterned aluminum film 116, a gate electrode (a gate wiring) 116a and a source wiring 116b are formed on a region 100A, and a gate electrode (a gate wiring) 116c and a source wiring 116b are formed on a region 100B. Here, the gate electrode 116a corresponds to the above-mentioned conductive film 25a, the source wiring 116b corresponds to the above-mentioned conductive film 25b, the gate electrode 116c corresponds to the above-mentioned conductive film 25c, and the source wiring 116d corresponds to the above-mentioned conductive film 25d.

The gate electrode (the gate wiring) 116a is constituted of the aluminum film 116 which is electrically connected with the gate of the vertical-type power MISFET (Q$_1$) which is formed on the region 100A, and the source wiring 116b is constituted of the aluminum film 116 which is electrically connected with the source of the vertical-type power MISFET (Q$_1$) which is formed on the region 100A. Further, the gate electrode (the gate wiring) 116c is constituted of the aluminum film 116 which is electrically connected with the gate of the vertical-type power MISFET (Q$_2$) which is formed on the region 100B, and the source wiring 116d is constituted of the aluminum film 116 which is electrically connected with the source of the vertical-type power MISFET (Q$_2$) which is formed on the region 100B.

Next, on the main surface of the semiconductor substrate 101, an insulation film (a protective film) 117 which is made of a polyimide resin or the like, for example, for protecting the surface is formed. Then, by patterning the insulation film 117 using a photolithography technique and an etching technique, an opening portion 118 (corresponds to the above-mentioned opening portion 24) in which portions of the gate electrodes 116a, 116c and the source wirings 116b, 116d are exposed is formed and hence, a bonding pad is formed. In the region 100A, the gate electrode 116a which is exposed from the opening portion 118 of the insulation film 117 becomes the above-mentioned gate electrode 14a of the semiconductor chip 2, and the source wiring 116b which is exposed from the opening portion 118 of the insulation film 117 becomes the above-mentioned source electrode 13a. Here, in the region 100B, the gate electrode 116c which is exposed from the opening portion 118 of the insulation film 117 becomes the above-mentioned gate electrode 14b of the semiconductor chip 2, and the source wiring 116d which is exposed from the opening portion 118 of the insulation film 117 becomes the above-mentioned source electrode 13b.

Next, a thickness of a back surface of the semiconductor substrate 101 is decreased by grinding or polishing the back surface. Thereafter, the back surface of the semiconductor substrate 101 is coated with nickel, titanium, nickel or gold, for example, using a vapor deposition method or the like. This drain electrode 119 constitutes the above-mentioned drain electrode 15 of the semiconductor chip 2.

In such a manner, the semiconductor element like the vertical-type power MISFET which possesses the trench gate structure is formed in the semiconductor substrate 101. That is, the vertical-type power MISFET which corresponds to the above-mentioned vertical-type power MISFET$Q_1$ is formed on the region 100A of the semiconductor substrate 101, and the vertical-type power MISFET which corresponds to the above-mentioned vertical-type power MISFET$Q_2$ is formed on the region 100B of the semiconductor substrate 101. The vertical-type power MISFET ($Q_1$) which is formed on the region 100A is electrically separated from the vertical-type power MISFET ($Q_2$) which is formed on the region 100B to each other by the insulation layer 102. However, each drain is electrically connected with the drain electrode 119 (the drain electrode 15) and hence, a common drain is provided.

Next, as shown in FIG. 14, on both the gate electrode 116a which is exposed from the opening portion 118 of the insulation layer 117 (that is, on the gate electrodes 14a, 14b) and the source wiring 116b which is exposed from the opening portion 118 of the insulation layer 117 (that is, the source electrode 13a, 13b), a bump electrode 121 such as a gold (Au) bump is formed. It is possible to form the bump electrode 121 which is made of a gold bump using a wire bonding tool, for example. The bump electrode 121 corresponds to the above-mentioned bump electrode 16. It is also possible to form a solder bump as the bump electrode 121.

Then, the semiconductor substrate 101 is cut or diced using a dicing saw or the like and hence, the semiconductor substrate 101 is divided into the semiconductor chip 2 which is solidified. Due to such a constitution, the semiconductor chip (the semiconductor substrate) 2 on which the vertical-type power MISFETs $Q_1$, $Q_2$ which possess the trench gate structure are mounted is manufactured. Here, the vertical-type power MISFET corresponds to the MISFET which a current between the source and the drain flows to the thickness direction of the semiconductor substrate (the direction which is vertical to the main surface of the semiconductor substrate). Further, here, although the case of forming an n-channel type power MISFET is explained, it is possible to form a p-channel type power MISFET by reversing a conductive type from the n-type to the p-type.

Further, the lead frames 41, 42 which are used in the manufacturing of the semiconductor device 1 are formed of a conductor member which is made of a conductor. The lead frames 41, 42 are made of a metal material such as cupper or copper alloy, for example. As shown in FIG. 15 and FIG. 16, the lead frame 41 includes source terminal portions 43a, 43b which become source terminals 3a, 3b and gate terminal portions 44a, 44b which become gate terminals 4a, 4b. The lead frames 41, 42 are integrally formed with the source terminals 3a, 3b and gate terminals 4a, 4b. Further, the lead frame 42 includes a drain terminal portion 45 which becomes a drain terminal 5. It is possible to manufacture the lead frames 41, 42 by forming a metal plate (a copper plate or the like) into a predetermined shape by molding (press forming) or etching or the like, for example. Here, in practice, the lead frames 41, 42 have the constitution that a plurality of unit frames which are constituted of the above-mentioned each part are connected with each other.

After preparing the semiconductor chip 2 and the lead frames 41, 42, as shown in FIG. 15 and FIG. 16, the source electrodes 13a, 13b and the gate electrode 14a, 14b of the main surface 2a of the semiconductor chip 2 are connected with the source terminal portions 43a, 43b and the gate terminal portions 44a, 44b of the lead frame 41 through the bump electrode 16 (step S2). That is, the semiconductor chip 2 is flip-chip connected with the lead frame 41.

In step 2, first of all, the semiconductor chip 2 is arranged on the lead frame 41 in the state that the back surface 2b side of the semiconductor chip 2 directs upwardly so as to overlap the source terminal portions 43a, 43b and the gate terminal portions 44a, 44b of the lead frame 41 and the bump electrodes 16 on the source electrodes 13a, 13b and the gate electrodes 14a, 14b of the semiconductor chip 2 to each other in plane. Here, when the gold bumps are used as the bump electrodes 16, the bump electrodes 16 are bonded of the semiconductor chip 2 are bonded to the terminal portions 43a, 43b and the gate terminal portions 44a, 44b of the lead frame 41 by compression bonding processing or the like. When solder bumps are used as the bump electrodes 16, after arranging the semiconductor chip 2 on the lead frame 41, a solder reflow treatment is applied thus bonding the bump electrodes 16 to the source terminal portions 43a, 43b and the gate terminal portions 44a, 44b of the lead frame 41. Due to such a constitution, the source electrodes 13a, 13b and the gate electrodes 14a, 14b of the surface 2a of the semiconductor chip 2 are respectively bonded and electrically connected with the source terminal portions 43a, 43b and the gate terminal portions 44a, 44b of the lead frame 41 via the bump electrodes 16.

Figure 18:
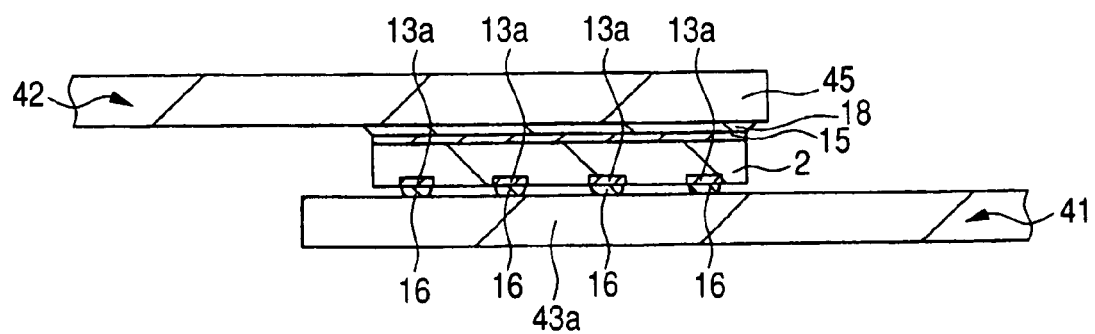
FIG. 18 is a cross-sectional view of the semiconductor device in the same manufacturing step shown in FIG. 17.
Figure 19:
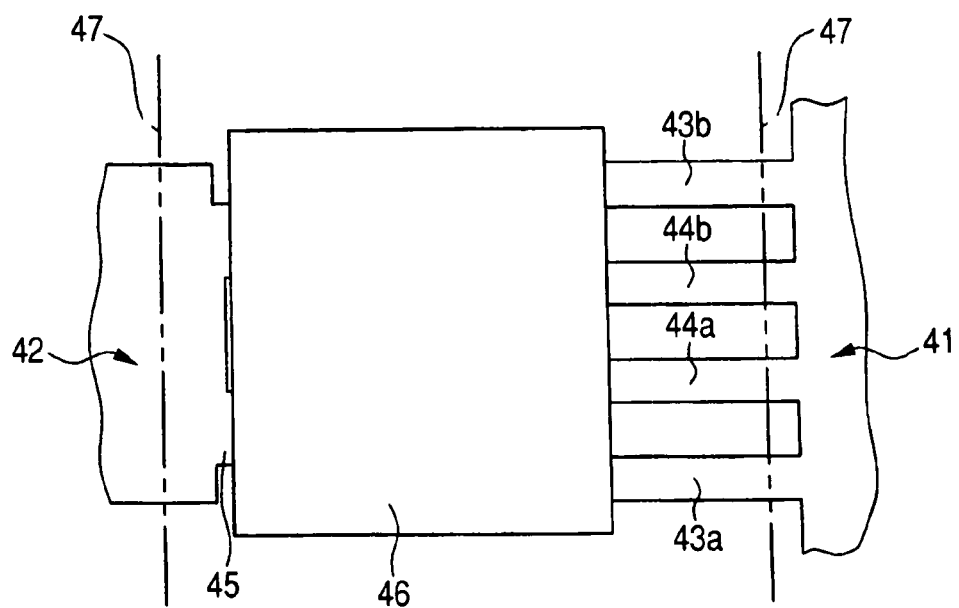
FIG. 19 is a plan view of the semiconductor device in FIG. 15 in a manufacturing step following the manufacturing step shown in FIG. 17.
Figure 20:
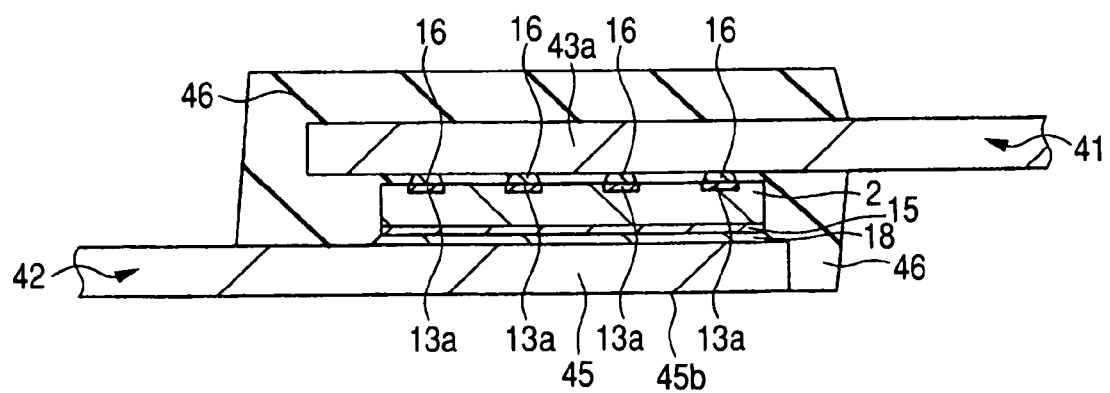
FIG. 20 is a cross-sectional view of the semiconductor device in the same manufacturing step shown in FIG. 19.

Next, as shown in FIG. 17 and FIG. 18, after arranging (applying) the bonding material (the adhesive material) 18 such as a silver (Ag) paste on the back surface 2b of the semiconductor chip 2, the lead frame 42 is arranged on the back surface 2b of the semiconductor chip 2 via the bonding material 18. That is, the lead frame 42 is arranged on the lead frame 41 and the semiconductor chip 2 so as to arrange the drain terminal portion 45 of the lead frame 42 on the drain electrode 15 of the back surface 2b of the semiconductor chip 2 via the bonding material 18. Due to the adhesion property (bonding property) of the bonding material 18, the lead frame 42 is temporarily fixed to the semiconductor chip 2. Then, the bonding material 18 is cured by applying the heat treatment or the like. Doe to such a constitution, the drain terminal portion 45 of the lead frame 42 is electrically connected with the drain electrode 15 of the back surface 2b of the semiconductor chip 2 by being bonded via the cured conductive bonding material 18 thus establishing an electrical connection.

Next, by performing a molding step (a resin sealing step, for example, a transfer molding step), a resin sealing portion 46 is formed and hence, the semiconductor chip 2 is sealed by the resin sealing portion 46 (step S4).

In step S4, the resin sealing portion 46 is formed so as to expose the lower surface 45b of the drain terminal portion 45 of the lead frame 42 from the back surface of the resin sealing portion 46. This step is the molding step of the step S4. This step may be realized by filling a material (a resin sealing material) for forming the resin sealing portion 46 in the inside of the cavity of a mold in a state that the lower surface 45b of the drain terminal portion 45 of the lead frame 42 is brought into contact (close contact) with a die for molding and by forming the resin sealing portion 46 by curing the filled resin sealing material. The resin sealing material for forming the resin sealing portion 46 is made of a resin material such as a thermosetting resin material, for example. Here, the resin sealing material can contain a filler and the like and hence, it is possible to use an epoxy resin and the like which includes the filler, for example. After forming the resin sealing portion 46, it is possible to eliminate burrs of the resin sealing portion 46 when necessary. Then, after applying the plating treatment, when necessary, it is possible to form plating layers (not shown in the drawings) on a portion (a portion which is formed of the conductor) which is exposed from the resin sealing portion 46 of the lead frames 41, 42. A solder plating treatment and the like using lead-free solder, for example may be applied.

Figure 21:
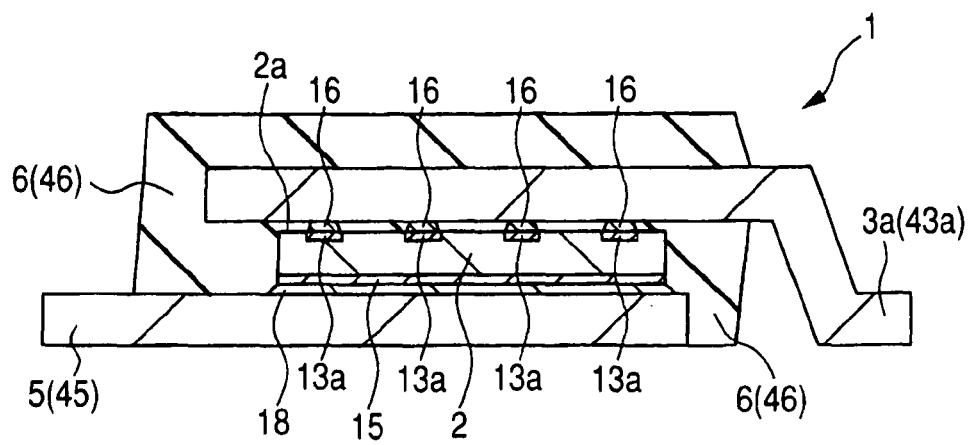
FIG. 21 is a cross-sectional view of the semiconductor device in a manufacturing step following the manufacturing step shown in FIG. 20.

Next, the lead frames 41, 42 are cut at the predetermined position (step S5). For example, in FIG. 19, the lead frame 41, 42 are cut along with a cut line 47 which is shown by a double dashed chain line and hence, the lead frames 41, 42 which are projected from the resin sealing portion 46 are eliminated. Then, the source terminals 3a, 3b and the gate terminal portions 44a, 44b which are projected from the resin sealing portion 46 are folded. Due to such a constitution, as shown in FIG. 21, the semiconductor device 1 which is divided into individual pieces may be obtained (manufactured). The semiconductor device 1 shown in FIG. 21 corresponds to the semiconductor device 1 shown in FIG. 1 to FIG. 7.

The resin sealing portion 46 becomes a resin sealing portion 6 of the semiconductor device 1. Further, the source terminal portions 43a, 43b which are separated from the lead frame 41 by cutting become the source terminals 3a, 3b of the semiconductor device 1, gate terminal portions 44a, 44b which are separated from the lead frame 41 by cutting become the gate terminal 4a, 4b of the semiconductor device 1, and a drain terminal portion 45 which is separated from the lead frame 42 by cutting becomes a drain terminal 5 of the semiconductor device 1.

Figure 22:
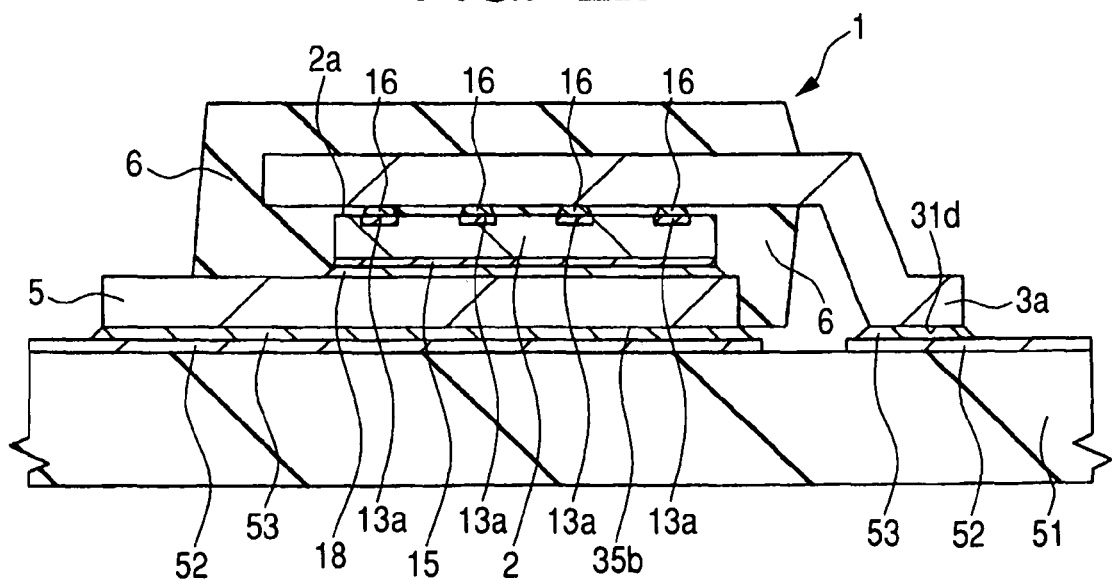
FIG. 22 is a cross-sectional view of an essential part of the state in which the semiconductor device according to the first embodiment of the present invention is mounted on a mounting substrate.
Figures 23, 24:
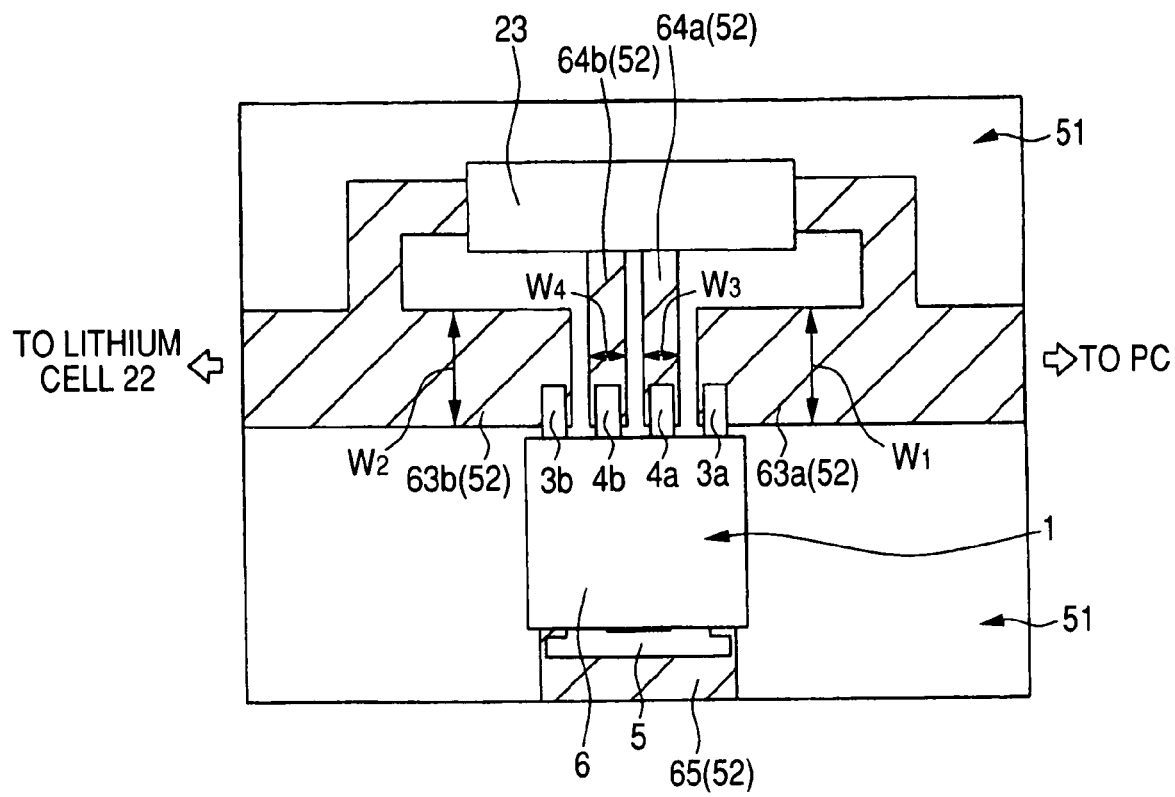
FIG. 23 is a plan view of an essential part of the state in which the semiconductor device according to the first embodiment of the present invention is mounted on the mounting substrate.
FIG. 24 is a chart showing an example of the ON resistances of the semiconductor device according to the first embodiment of the present invention and the semiconductor device of a comparison example.

FIG. 22 is a cross-sectional view of an essential part of the semiconductor device 1 according to this embodiment in a state that the semiconductor device 1 is mounted on a mounting substrate 51, and FIG. 23 is a plan view (a top plan view) of an essential part of the semiconductor device 1. Here, although FIG. 23 is the plan view, hatching is provided to a wiring pattern 52 for facilitating the understanding of the drawing.

As shown in FIG. 22 and FIG. 23, the semiconductor device 1 may be mounted on a mounting substrate (a printed circuit board) 51 which includes a plurality of lines. In mounting the semiconductor device 1 on the mounting substrate 51, a back surface 1b side of the semiconductor device 1 constitutes a mounting surface which faces the mounting substrate 51, wherein external connection terminals which are exposed on the back surface 1b side of the semiconductor device 1, that is, terminal surfaces 31d, 32d, 33d, 34d of the source terminals 3a, 3b and the gate terminals 4a, 4b and a lower surface 35b of the drain terminal 5 are bonded to a wiring pattern (lines, terminals, a conductor pattern) 52 of the mounting substrate 51 via conductive bonding materials 53 thus establishing electrical connections. The bonding materials 53 are made of solder or the like, for example. Accordingly, the exposed portions of the respective terminals 3a, 3b, 4a, 4b, 5 (that is, the terminal surfaces 31d, 32d, 33d, 34d of the source terminals 3a, 3b and the gate terminals 4a, 4b and the lower surface 35b of the drain terminals 5) from the resin sealing portion 6 in the semiconductor device 1 may be respectively electrically connected with the wiring pattern of the mounting substrate 51.

In mounting the semiconductor device 1 on the mounting substrate 51, first of all, a solder paste is applied to the wiring pattern 52 of the mounting substrate 51 and, thereafter, the semiconductor device 1 is arranged on the mounting substrate 51. Here, the semiconductor device 1 is mounted on the mounting substrate 51 in a state that the terminal surfaces 31d, 32d, 33d, 34d of the source terminals 3a, 3b and the gate terminals 4a, 4b and the lower surface 35b of the drain terminal 5 of the semiconductor device 1 are respectively arranged to be overlapped to the wiring pattern 52 of the mounting substrate 51 in plane, while the back surface 1b side of the semiconductor device 1 faces the mounting substrate 51. Then, solder reflow treatment is performed. In this treatment, the solder paste is melted and is solidified, wherein the semiconductor device 1 may be mounted on the mounting substrate 51 using the solidified solder as a bonding material 53 (solder). Further, a control IC 23 is also mounted on the mounting substrate 51 and the control IC 23 and the semiconductor device 1 are electrically connected with each other via a wiring pattern 52 thus allowing the control IC 23 to control the semiconductor device 1.

On the back surface 1b of the semiconductor device 1, as external terminals, the terminal surface 31d of the source terminal 3a, the terminal surface 33d of the gate terminal 4a, the terminal surface 34d of the gate terminal 4b and the terminal surface 32d of the source terminal 3b are arranged in order from one direction. In conformity with the arrangement of these terminal surfaces 31d, 32d, 33d, 34d, a layout of the wiring pattern 52 on the mounting substrate 51 is performed. Accordingly, the wiring pattern 52 on the mounting substrate 51 adopts the layout in which the source wiring pattern 63a, the gate wiring pattern 64a, the gate wiring pattern 64b and the source wiring pattern 63b are arranged in order from one direction. Here, the terminal surface 31d of the source terminal 3a of the semiconductor device 1 is bonded to the source wiring pattern 63a out of the wiring pattern 52 via the bonding material 53 thus establishing the electrical connection therebetween, while the terminal surface 32d of the source terminal 3b of the semiconductor device 1 is bonded to the source wiring pattern 63b out of the wiring pattern 52 via the bonding material 53 thus establishing the electrical connection therebetween. Further, the terminal surface 33d of the gate terminal 4a of the semiconductor device 1 is bonded to the gate wiring pattern 64a out of the wiring pattern 52 via the bonding material 53 thus establishing the electrical connection therebetween, while the terminal surface 34d of the gate terminal 4b of the semiconductor device 1 is bonded to the gate wiring pattern 64b out of the wiring pattern 52 via the bonding material 53 thus establishing the electrical connection therebetween. Further, the lower surface 35b of the drain terminal 5 of the semiconductor device 1 is bonded to the drain wiring pattern 65 out of the wiring pattern 52 via the bonding material 53 thus establishing the electrical connection therebetween.

In this embodiment, on the back surface 1b side of the semiconductor device 1, the terminal surface 31d of the source terminal 3a, the terminal surface 33d of the gate terminal 4a, the terminal surface 34d of the gate terminal 4b and the terminal surface 32d of the source terminal 3b are arranged in order from one direction, wherein the terminal surfaces 33d, 34d of the gate terminals 4a, 4b are arranged inside and the terminal surfaces 31d, 32d of the source terminals 3a, 3b are arranged outside. Accordingly, the source wiring patterns 63a, 63b to which the terminal surfaces 31d, 32d of the source terminals 3a, 3b are connected are arranged outside the gate wiring patterns 64a, 64b and hence, the degree of freedom of the layout of the gate wiring patterns 64a, 64b is increased whereby it is possible to form the source wiring patterns 63a, 63b having large widths. That is, it is possible to set the widths $W_1$, $W_2$ of the source wiring patterns 63a, 63b larger than widths $W_3$, $W_4$ of the gate wiring patterns 64a, 64b ($W_1$, $W_2 > W_3$, $W_4$). Accordingly, it is possible to reduce the substrate wiring resistance of the source wiring patterns 63a, 63b and hence, the wiring loss may be reduced. Further, the layout of the wiring pattern 52 may be performed simply and hence, the layout of the wiring pattern 52 may be performed with a relatively small area compared to a case to which this embodiment is not applied whereby the area of the mounting substrate 51 may be further decreased.

Next, advantageous effects of the semiconductor device 1 of this embodiment are explained in further detail.

As shown in FIG. 1, the $Li^+$ battery pack 21 is used in a mode that two power MISFETs $Q_1$, $Q_2$ for charging and discharging which use the drain D in common are connected with the $Li^+$ cell ($Li^+$ battery) 22 as switching elements. Different from this embodiment, when two semiconductor packages each of which seals the semiconductor chip which forms the power MISFET therein with resin are prepared and are used as switching elements of the $Li^+$ battery pack, the $Li^+$ battery pack becomes large sized. Accordingly, in this embodiment, two power MISFETs $Q_1$, $Q_2$ are formed in one semiconductor chip 2 and, semiconductor chip 2 is sealed with resin thus forming the semiconductor package (the semiconductor device 1), and the semiconductor device 1 is used as a charging/discharging switch element of the $Li^+$ battery pack 21 (battery), whereby the switching elements may be constituted of one semiconductor device 1 thus realizing the miniaturization of the $Li^+$ battery pack 21.

Figure 37:
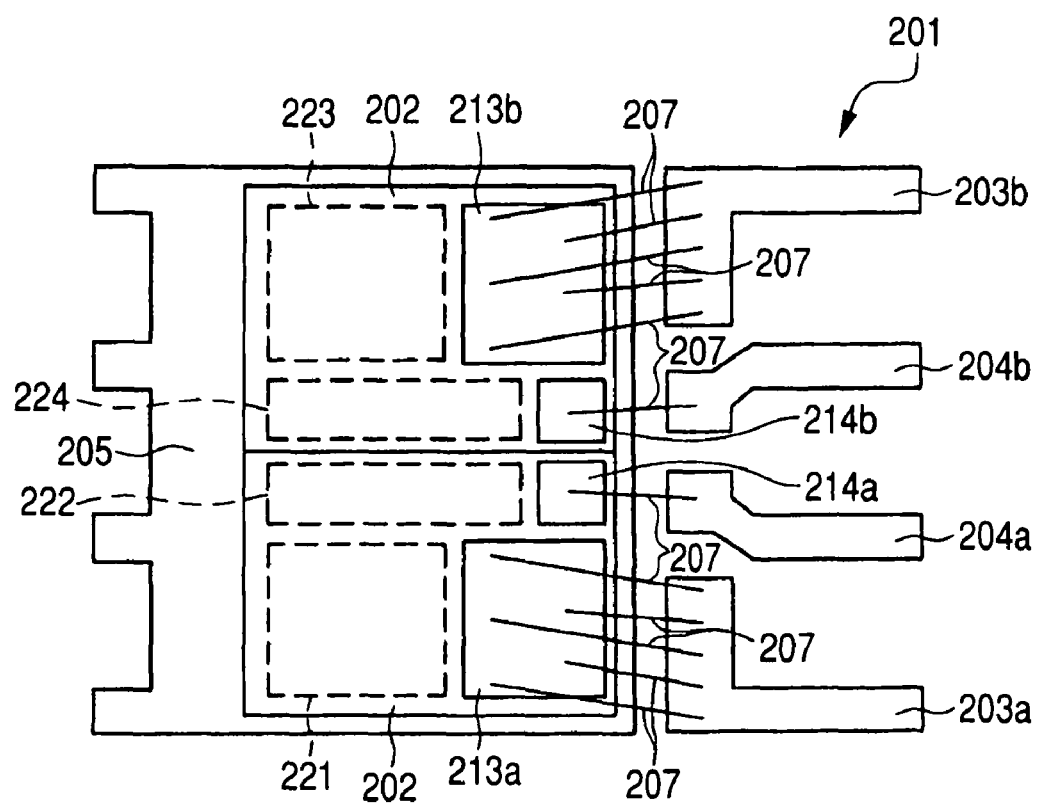
FIG. 37 is a perspective plan view of the semiconductor device according to another comparison example.

FIG. 37 is a planner perspective view of the semiconductor device 201 of the comparison example which inventors of the present invention have studied, and corresponds to an upper surface of the semiconductor device 201 of the comparison example when the resin sealing portion (not shown in the drawing) is observed in a see-through manner and substantially corresponds to FIG. 4.

The semiconductor device 201 of the comparison example shown in FIG. 37 includes a semiconductor chip 202, source terminals 203a, 203b, gate terminals 204a, 204b and a drain terminal 205, and a resin sealing portion (not shown in the drawing) which seals these components. On the semiconductor chip 202, two vertical MISFETs which correspond to the power $MISFETQ_1$, $Q_2$ are formed.

On a surface of the semiconductor chip 202, as pad electrodes, a source electrode 213a which is electrically connected with a source of the power $MISFETQ_1$, a gate electrode 214a which is electrically connected with a gate of the power $MISFETQ_1$, a gate electrode 214b which is electrically connected with a gate of the power $MISFETQ_2$, and a source electrode 213b which is electrically connected with a source of the power $MISFETQ_2$ are formed. Further, on a whole back surface of the semiconductor chip 202, a drain electrode (not shown in the drawing) which is electrically connected with drains of the power $MISFETQ_1$, $Q_2$ is formed. The source electrodes 213a, 213b and the gate electrodes 214a, 214b of the semiconductor chip 202 are respectively electrically connected with the source terminals 203a, 203b and the gate terminals 204a, 204b via bonding wires 207. Further, the drain electrode formed on the back surface of the semiconductor chip 202 is bonded to a drain terminal 205 via a conductive bonding material thus establishing an electrical connection therebetween.

In the semiconductor device 201 of the comparison example having such a constitution, the source electrode 213a, the gate electrode 214a, the gate electrode 214b and the source electrode 213 are arranged in order from one direction, wherein the source electrodes 213a, 213b of the semiconductor chip 202 are arranged outside and the gate electrodes 214a, 214b are arranged inside. Due to such an arrangement, as external terminals, the source terminals 203a, 203b may be arranged outside and the gate terminals 204a, 204b may be arranged inside. Accordingly, in a mounting substrate on which the semiconductor device 201 of the comparison example is mounted, a source wiring pattern which connects the source terminals 203a, 203b is arranged outside a gate wiring pattern which connects the gate terminals 204a, 204b and hence, the degree of freedom of a layout of the wiring pattern is increased whereby the source wiring pattern may be formed with a large width. Accordingly, the substrate wiring resistance of the source wiring pattern is reduced and hence, the wiring loss may be reduced. Further, the layout of the wiring pattern on the mounting substrate on which the semiconductor device 201 is mounted may be simplified and hence, the layout of the wiring pattern may be performed with the small area whereby an area of the mounting substrate may be made small.

In the semiconductor device 201 of the comparison example, the source resistance may be reduced by increasing the number of bonding wires 207 which connect the source electrodes 213a, 213b and the source terminals 203a, 203b of the semiconductor chip 202. However, when the source electrodes 213a, 213b and the source terminals 203a, 203b are connected with each other via the bonding wires 207 as in the case of the semiconductor device 201 of the comparison example, the source electrodes 213a, 213b are provided only at positions relatively close to the source terminals 203a, 203b which are arranged remote from the semiconductor chip 202 and are not formed on regions 221, 222, 223, 224 shown in FIG. 37. Here, the region 221 corresponds to a region in the extending direction toward the source electrode 213a from the source terminal 203a on the surface of the semiconductor chip 201, while the region 222 corresponds to a region in the extending direction toward the source electrode 213b from the source terminal 203b on the surface of the semiconductor chip 201. Further, the region 223 corresponds to a region in the extending direction toward the gate electrode 214a from the gate terminal 204a on the surface of the semiconductor chip 201, while the region 224 corresponds to a region in the extending direction toward the gate electrode 214b from the gate terminal 204b on the surface of the semiconductor chip 201.

In the semiconductor device 201 of the comparison example, even when the source electrodes 213a, 213b are formed such that the source electrodes 213a, 213b also extend to (exist in) the regions 221, 222, 223, 224, it is difficult to connect the bonding wires 207 to the regions 221, 222, 223, 224. The reason is that the regions 221, 222, 223, 224 are positioned remote from the source terminals 203a, 203b and hence, a length of bonding wires which connect the regions 221, 222, 223, 224 and the source terminals 203a, 203b is elongated. Accordingly, even when the regions 221, 222, 223, 224 and the source terminals 203a, 203b are connected by the bonding wires, such connection hardly contributes to the reduction of the source resistance. Further, the number of bonding wires 207 which are connectable to the source terminals 203a, 203b is determined based on an area which allows the bonding of the source terminals 203a, 203b. When the number of connectable bonding wires 207 is limited, for reducing the source resistance, it is advantageous to connect the source electrodes 213a, 213b which are positioned close to the source terminals 203a, 203b with the source terminals 203a, 203b using all bonding wires 207.

Further, even when the source electrodes 213a, 213b are formed such that the source electrodes 213a, 213b extend to the regions 222, 224, it is difficult to connect the regions 222, 224 and the source terminals 203a, 203 busing the bonding wires 207. This is because that there exists a possibility that the bonding wires which connect the regions 222, 224 and the source terminals 203a, 203b cross and are brought into contact with the bonding wires which connect the gate electrodes 214a, 214b and the gate terminals 204a, 204b.

Accordingly, as in the case of the semiconductor device 201 of the comparison example, the source terminals 203a, 203b are connected only to the source electrodes 213a, 213b which are positioned close to the source terminals 203a, 203b via the bonding wires 207. Accordingly, in the semiconductor device 201 of the comparison example, the regions 221, 222, 223, 224 on the surface of the semiconductor chip 202 can not be effectively used and the regions 221, 222, 223, 224 define dead spaces and hence, there exists a limit with respect to the reduction of the ON resistance.

To the contrary, in this embodiment, as shown in FIG. 2 to FIG. 9, the source electrodes 13a, 13b and the gate electrodes 14a, 14b of the semiconductor chip 2 are electrically connected with the source terminals 3a, 3b and the gate terminals 4a, 4b via bump electrodes 16 without using the bonding wires.

In this embodiment, on the first MISFET region 10a side of the main surface 2a of the semiconductor chip 2, the gate electrode 14a and the bump electrodes 16 which are disposed above the gate electrode 14a are provided at a position relatively close to the gate terminal 4a and, the source electrodes 13a and the bump electrodes 16 which are disposed above the source electrodes 13a are uniformly arranged on regions other than the regions where the gate electrodes 14a and the bump electrodes 16 are arranged. Further, on the second MISFET region 10b side of the main surface 2a of the semiconductor chip 2, the gate electrode 14b and the bump electrodes 16 which are disposed above the gate electrode 14b are provided at a position relatively close to the gate terminal 4b and, the source electrodes 13b and the bump electrodes 16 which are disposed above the source electrodes 13b are uniformly arranged on regions other than the regions where the gate electrode 14b and the bump electrode 16 are arranged. Here, the gate electrodes 14a, 14b and the source electrodes 13a, 13b are connected with the gate terminals 4a, 4b and the source terminals 3a, 3b which are extended above the gate electrodes 14a, 14b and the source electrodes 13a, 13b respectively via the bump electrodes 16.

In this embodiment, the source electrodes 13a and the source terminals 3a of the semiconductor chip 2 are electrically connected with each other via a plurality of bump electrodes 16, and the source electrodes 13b and the source terminals 3b of the semiconductor chip 2 are electrically connected with each other via a plurality of bump electrodes 16 and hence, it is possible to reduce the source resistance.

Further, in this embodiment, on the most region of the main surface 2a of the semiconductor chip 2 other than the region where gate electrodes 14a, 14b are formed, the source terminals 3a, 3b which are formed of a low-resistance conductive plate are extended thus connecting the source electrodes 13a, 13b of the semiconductor chip 2 and the source terminals 3a, 3b which are extended above the source electrodes 13a, 13b respectively via a plurality of bump electrodes 16. The source terminals 3a, 3b which are formed of a low-resistance conductive plate, different from fine-wire-like members such as bonding wires, hardly exhibit the difference in resistance even when the position where the bump electrodes 16 and the source terminals 3a, 3b are connected with each other differs. Accordingly, in the semiconductor chip 2, by arranging the source electrodes 13a, 13b and the bump electrodes 16 above the source electrodes 13a, 13b at positions which correspond to the regions 221, 222, 223, 224 which are explained in conjunction with the semiconductor device 201 of the comparison example, the bump electrodes 16 may be connected with the source terminals 3a, 3b which are extended above the bump electrodes 16 thus further reducing the source resistance. That is, even the source electrodes 13a, 13b and the bump electrodes 16 which are arranged at positions which correspond to the regions 221, 222, 223, 224 can sufficiently contribute to reduction of the source resistance and hence, the source resistance may be further reduced.

Further, when the bonding wires are used in the same manner as the semiconductor device 201 of the comparison example, when the source electrodes 213a, 213b are extended to the regions 222, 224 and the bonding wires are connected with the regions 222, 224, there exists a possibility that the bonding wires which connect the source electrodes 213a, 213b and the source terminals 203a, 203b cross and are brought into contact with the bonding wires which connect the gate electrodes 214a, 214b and the gate terminals 204a, 204b. This phenomenon lowers a manufacturing yield rate of the semiconductor device.

On the contrary, in this embodiment, the gate electrodes 14a, 14b and the source electrodes 13a, 13b are connected with the gate terminals 4a, 4b and the source terminals 3a, 3b which extend over the gate electrodes 14a, 14b and the source electrodes 13a, 13b via the bump electrodes 16. Accordingly, it is possible to prevent the members (bump electrodes 16) which connect between the gate electrodes 14a, 14b and the gate terminals 4a, 4b and the members (bump electrodes 16) which connect between the source electrodes 13a, 13b and the source terminals 3a, 3b from coming into contact with each other.

Accordingly, in the semiconductor device 1 of this embodiment, on the first MISFET region 10a side of the surface 2a of the semiconductor chip 2, in the region except for the gate terminal 4a, including the region (the region 66a) shown in FIG. 4) corresponding to the region 222 explained in conjunction with the semiconductor device 201 of the comparison example, it is possible to uniformly form the source electrode 13a whereby the source electrode 13a may be electrically connected with the source terminal 3a via a plurality of bump electrodes 16. In the same manner, on the second MISFET region 10b side of the surface 2a of the semiconductor chip 2, in the region except for the gate terminal 4b, including the region (the region 66b shown in FIG. 4) corresponding to the region 224 explained in conjunction with the semiconductor device 201 of the comparison example, it is possible to uniformly form the source electrode 13b whereby the source electrode 13b may be electrically connected with the source terminal 3b via a plurality of bump electrodes 16.

In this embodiment, a portion 31a which extends over the surface 2a of the semiconductor chip 2 out of the source terminal 3a also exists in the extending direction toward the portion of the gate terminal 4a in the inside of the resin sealing portion 6 from the portion of the gate terminal 4a exposed from the resin sealing portion 6 and includes the region in the extending direction (corresponding to the region 66a shown in FIG. 4). Also in the region 66a, the source electrode 13a of the semiconductor chip 2 is bonded to the source terminal 3a (portion 31a of the source terminal 3a) which extends above the source electrode 13a via the bump electrode 16 thus establishing an electrical connection therebetween. Further, a portion 32a which extends over the surface 2a of the semiconductor chip 2 out of the source terminal 3b also exists in the extending direction toward the portion of the gate terminal 4b in the inside of the resin sealing portion 6 from the portion of the gate terminal 4b exposed from the resin sealing portion 6 and includes the region in the extending direction (corresponding to the region 66b shown in FIG. 4). Also in the region 66b, the source electrode 13b of the semiconductor chip 2 is bonded to the source terminal 3b (portion 32a of the source terminal 3b) which extends above the source electrode 13b via the bump electrode 16 thus establishing an electrical connection therebetween.

For example, the bump electrodes 16 which connect the source electrodes 13a and the source terminals 3a of the semiconductor chip 2 are arranged on the surface 2a (first MISFET region 10a side of the surface 2a) of the semiconductor chip 2 in plural rows, while portions of the bump electrodes 16 which connect the source electrodes 13a and the source terminals 3a of the semiconductor chip 2 and the bump electrodes 16 which connect the gate electrodes 14a and the gate terminals 4a of the semiconductor chip 2 are arranged on the same row. Further, the bump electrodes 16 which connect the source electrodes 13b and the source terminals 3b of the semiconductor 2 are arranged on the surface 2a (second MISFET region 10b side of the surface 2a) of the semiconductor chip 2 in plural rows, while portions of the bump electrodes 16 which connect the source electrodes 13b and the source terminals 3b of the semiconductor chip 2 and the bump electrodes 16 which connect the gate electrodes 14b and the gate terminals 4b of the semiconductor chip 2 are arranged on the same row. Accordingly, in the semiconductor device 1 of this embodiment, on the surface 2a of the semiconductor chip 2, the bump electrodes 16 which connect the source electrodes 13a, 13b and the source terminals 3a, 3b are uniformly arranged on the surface 2a of the semiconductor chip 2 in a spaced-apart manner over the substantially whole region except for the gate electrodes 14a, 14b and the vicinity thereof. Then, a plurality of these bump electrodes 16 are connected with the source terminals 3a, 4a which extend over the regions (including regions 66a, 66b) except for the gate electrodes 14a, 14b and the vicinity thereof on the surface 2a of the semiconductor chip 2.

In this manner, in the semiconductor device 1 of this embodiment, it is possible to effectively use the region of the surface 2a of the semiconductor chip 2 thus preventing the generation of dead spaces such as the regions 221, 222, 223, 224 in the above-mentioned semiconductor device 201 on the surface 2a of the semiconductor chip 2. Accordingly, it is possible to further reduce the source resistance of the semiconductor device 1 and hence, the ON resistance can be further reduced.

FIG. 24 is a table showing one example of ON resistance of the semiconductor device 1 of this embodiment and the semiconductor device 201 of the comparison example. As shown in FIG. 24, the semiconductor device 1 of this embodiment can, compared with the semiconductor device 201 of the comparison example, reduce the ON resistance of a semiconductor device unit (state before mounting) by approximately 30%. In this manner, in the semiconductor device 1 of this embodiment, the ON resistance may be reduced by lowering the source resistance and hence, it is possible to reduce the heat value of the semiconductor device 1 whereby the performance and the reliability of the semiconductor device may be enhanced. Further, since the heat value of the semiconductor device 1 may be reduced, the designing of the battery as a whole or the battery protective circuit may be made easily thus advantageously realizing the reduction of manufacturing cost and the miniaturization.

Source potentials are supplied to sources of the power MISFET $Q_1$, $Q_2$ formed on the semiconductor chip 2 via the source terminals 3a, 3b, the bump electrodes 16 and the source electrodes 13a, 13b. In the semiconductor device 1 of this embodiment, it is possible to uniformly form the source electrodes 13a, 13b and the bump electrodes 16 on the source electrodes 13a, 13b on the regions of the surface 2a of the semiconductor chip 2 except for the gate terminals 4a, 4b. Accordingly, it is possible to prevent the supplied source potential from being fluctuated depending on the planar position of the semiconductor chip 2.

Further, in this embodiment, as described above, on the surface 2a of the semiconductor chip 2, the arrangement of the source electrodes 13a and the gate electrodes 14a and the arrangement of the source electrodes 13b and the gate electrodes 14b assume the line symmetrical relationship with respect to lines 20a, 20b which passes between the first MISFET region 10a and the second MISFET region 10b. Accordingly, the connecting position (position of bump electrode 16) between the source electrode 13a and the source terminal 3a of the semiconductor chip 2 and the connecting position (position of bump electrode 16) between the source electrode 13b and the source terminal 3b of the semiconductor chip 2 assume the line symmetrical relationship with respect to lines 20a, 20b which passes between the first MISFET region 10a and the second MISFET region 10b. Accordingly, when the same source potential is supplied to the sources of the power MISFET $Q_1$, $Q_2$ formed in the semiconductor chip 2 from the source terminals 3a, 3b, it is possible to set source potential applying states to the power MISFET $Q_1$, $Q_2$ equal. Accordingly, it is possible to use the power MISFET $Q_1$, $Q_2$ as equivalent transistor elements.

Further, in this embodiment, the explanation has been made with respect to the case in which the power MISFET $Q_1$, $Q_2$ which are formed in the semiconductor chip 2 are constituted of the vertical-type power MISFET having the trench-type gate structure. As another mode, the power MISFET $Q_1$, $Q_2$ which are formed in the semiconductor chip 2 may be constituted of a power MISFET having the planer-type gate structure or the power MISFET $Q_1$, $Q_2$ of the semiconductor chip 2 may be formed of a lateral-type power MISFET. Accordingly, the power MISFET $Q_1$, $Q_2$ which are formed in the semiconductor chip 2 (the first MISFET region 10a and the second MISFET region 10b) may be respectively constituted of the vertical or lateral power MISFET having the trench-type gate structure or the planer-type gate structure.

Embodiment 2

In the above-mentioned embodiment 1, the source electrodes 13a, 13b and the gate electrodes 14a, 14b of the semiconductor chip 2 are electrically connected with the source terminals 3a, 3b and the gate terminals 4a, 4b via the bump electrode 16. In this embodiment, source electrodes 13a, 13b and gate electrodes 14a, 14b of a semiconductor chip 2c are electrically connected with source terminals 3a, 3b and gate terminals 4a, 4b via a conductive bonding material 71.

Figure 25:
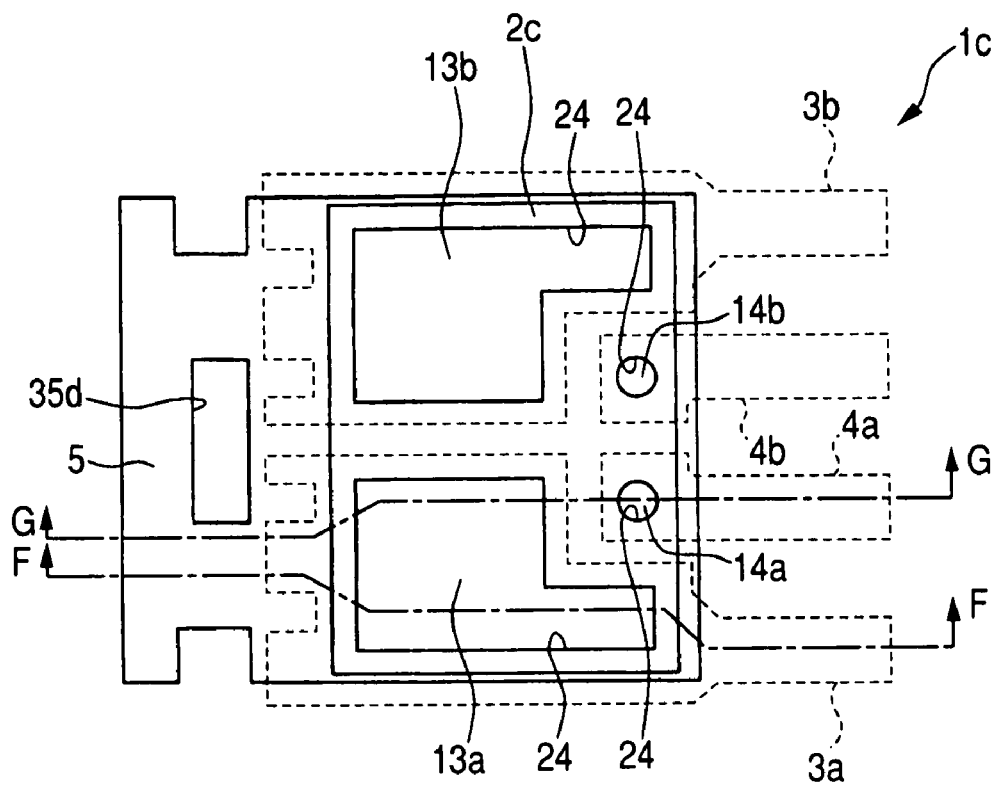
FIG. 25 is a perspective plan view showing the semiconductor device according to the second embodiment of the present invention.
Figure 26:
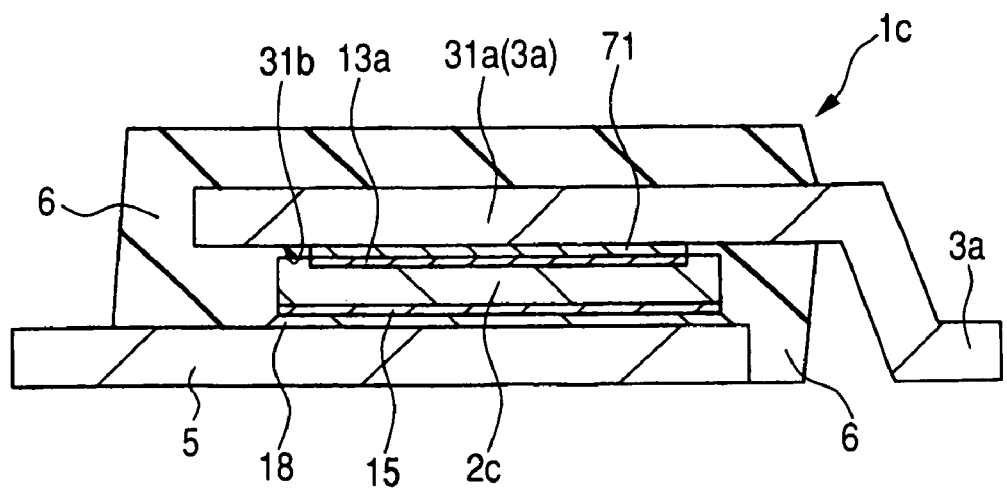
FIG. 26 is a cross-sectional view of the semiconductor device according to the second embodiment of the present invention.
Figure 27:
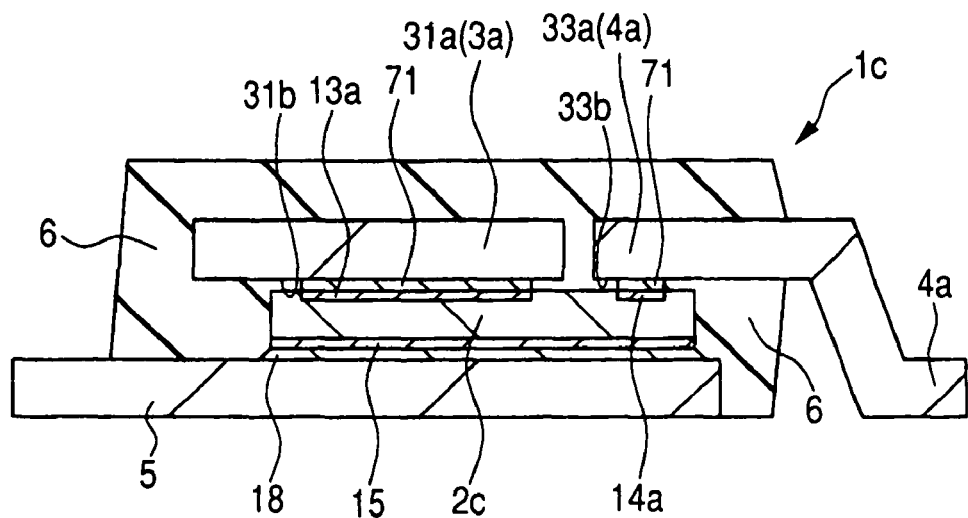
FIG. 27 is a cross-sectional view of the semiconductor device according to the second embodiment of the present invention.

FIG. 25 is a perspective plan view of the semiconductor device 1c according to this embodiment and FIG. 26 and FIG. 27 are cross-sectional views (cross-sectional side views) of the semiconductor device 1c. Here, FIG. 25 corresponds to a top plan view of the semiconductor device 1c in a state that a resin sealing portion 6, source terminals 3a, 3b and gate terminals 4a, 4b are observed in a see-through manner and corresponds to FIG. 5 of the above-mentioned embodiment 1. Further, a cross section of the semiconductor device 1c at a position taken along a line F-F in FIG. 25 corresponds to FIG. 26 and a cross section of the semiconductor device 1c at a position taken along a line G-G in FIG. 25 corresponds to FIG. 27.

In a surface 2a of the semiconductor chip 2c used in the semiconductor device 1c of this embodiment, an opening portion 24 having an area relatively larger than the corresponding opening in the above-mentioned embodiment 1 is formed thus exposing conductive films 25b, 25d whereby source electrodes 13a, 13b having an area which is relatively larger corresponding area in the above-mentioned embodiment 1 are formed one by one. That is, on the surface 2a of the semiconductor chip 2, the source electrodes 13a, 13b are respectively formed on the substantially whole area except for the gate electrodes 14a, 14b and the vicinities of these gate electrodes 14a, 14b. In the same manner, in the surface 2a of the semiconductor chip 2c, the opening portion 24 having an area relatively larger than the corresponding opening in the above-mentioned embodiment 1 is formed thus exposing conductive films 25a, 25c whereby the gate electrodes 13a, 13b having an area which is relatively larger corresponding area in the above-mentioned embodiment 1 are formed one by one. Here, in the same manner as the semiconductor chip 2 in the above-mentioned embodiment 1, the source electrode 13a and the gate electrode 14a are mounted on the first MISFET region 10a side on the surface 2a of the semiconductor chip 2c, while the source electrode 13b and the gate electrode 14b are mounted on the second MISFET region 10b side on the surface 2a of the semiconductor chip 2c. Further, in this embodiment, bump electrodes 16 are formed neither on the source electrodes 13a, 13b nor on the gate electrodes 14a, 14b. Since other constitutions of the semiconductor chip 2c are approximately the same as the semiconductor chip 2 in the above-mentioned embodiment 1, the explanation of the other structures of the semiconductor chip 2c is omitted here.

In the semiconductor device 1c according to this embodiment, a source electrode 13a of the semiconductor chip 2c is bonded to a bottom surface 31b of a portion 31a extending on the surface 2a of the semiconductor chip 2c in the source terminals 3a via the conductive bonding material 71 thus establishing an electrical connection therebetween. Further, the source electrode 13b of the semiconductor chip 2c is bonded to a lower surface 32b of the portions 32a extending on the surface 2a of the semiconductor chip 2 in the source terminals 3b via the conductive bonding material 71 thus establishing an electrical connection therebetween. Further, the gate electrode 14a of the semiconductor chip 2c is bonded to a lower surface 33b of the portions 33a extending on the surface 2a of the semiconductor chip 2 in the gate terminals 4a via the conductive bonding material 71 thus establishing an electrical connection therebetween. Further, the gate electrode 14b of the semiconductor chip 2c is bonded to a lower surface 34b of the portions 34a extending on the surface 2a of the semiconductor chip 2 in the gate terminals 4b by way of the conductive bonding material 71 thus establishing an electrical connection therebetween. It is possible to use a conductive pasting material such as a silver paste, for example, as the bonding material 71. As other kind of the bonding material 71, solder may be used.

Since other constitutions of the semiconductor device 1c are approximately the same as the semiconductor device 1 in the above-mentioned embodiment 1, the explanation of the other structures of the semiconductor device 1c is omitted here.

In manufacturing the semiconductor device 1c according to this embodiment, in step S1 of the above-mentioned embodiment 1, the semiconductor chip 2c is formed approximately in the same manner as the semiconductor chip 2 except for that bump electrodes 121 are not formed. Further, in step S$_2$ of the above-mentioned embodiment 1, the source electrodes 13a, 13b and gate electrodes 14a, 14b on the surface 2a of the semiconductor chip 2 are bonded to the source terminals 43a, 43b and the gate terminals 44a, 44b of a lead frame 41 by way of the bonding material 71 such as the conductive pasting material. It is possible to perform curing of the bonding material 71 before step S3 or in step S3 in which the bonding material 18 is cured. Except for these steps, the semiconductor device 1c according to this embodiment 1 may be manufactured approximately in the same manner as the above-mentioned embodiment 1.

Further, the semiconductor device 1c may be mounted on a mounting substrate 51 in the same manner as the semiconductor device 1 of the above-mentioned embodiment 1, wherein a mounting substrate 51 used in the semiconductor device 1c of this embodiment is approximately equal to the mounting substrate of the above-mentioned embodiment 1 and hence, the explanation of the mounting substrate 51 is omitted here.

Also this embodiment may obtain advantageous effects substantially equal to the advantageous effects of the above-mentioned embodiment 1.

That is, also in this embodiment, in the same manner as the above-mentioned embodiment 1, the extending portion 31a on the surface 2a of the semiconductor chip 2 in the source terminal 3a also exists on the gate terminal 4a in the extending direction of the portion exposing from the resin sealing portion 6 towards the inside of the resin sealing portion 6 and includes a region of the extending direction (which corresponds to the region 66a shown in FIG. 4). Also in this region 66a, the source electrode 13a and the source terminal 3a of the semiconductor chip 2 are bonded connected with each other by way of the bonding material 71 thus establishing an electrical connection therebetween. Further, the portion 32a extending on the surface 2a of the semiconductor chip 2 in the source terminal 3b also exists on the gate terminal 4b in the extending direction of the portion exposing from the resin sealing portion 6 towards the inside of the resin sealing portion 6 and includes a region of the extending direction (which corresponds to the region 66b shown in FIG. 4). Also in this region 66b, the source electrode 13b and the source terminal 3b of the semiconductor chip 2 are bonded to each other by way of the bonding material 71 thus establishing an electrical connection therebetween. Accordingly, in the semiconductor device 1c according to this embodiment, on the surface 2a of the semiconductor chip 2, source electrodes 13a, 13b may be arranged approximately in the whole region except for the gate electrodes 14a, 14b and the vicinity region thereof (including regions 66a, 66b) and the source electrodes 13a, 13b may be connected by using the bonding material 71 to the source terminals 3a, 4a extending on the region except for the gate electrodes 14a, 14b and the vicinity region thereof (including regions 66a, 66b) on the surface 2a of the semiconductor chip 2. Accordingly, source resistance may be reduced and the ON resistance of the semiconductor device 1 may be also reduced. Further, the source electrodes 13a, 13b and the gate electrodes 14a, 14b of the semiconductor chip 2c are connected with the source terminals 3a, 3b and the gate terminals 4a, 4b via the bonding material 71 and hence, the contact area between the source terminals 3a, 3b, the gate terminals 4a, 4b and the source electrodes 13a, 13b, the gate electrodes 14a, 14b of the semiconductor chip 2c may be enlarged so that the source resistance and the ON resistance of the semiconductor device 1c may be further reduced.

Further, it is also possible to combine this embodiment and the above-mentioned embodiment 1. That is, with respect to the connection between the source electrodes 13a, 13b and the source terminals 3a, 3b and the connection between the gate electrodes 14a, 14b and the gate terminals 4a, 4b, either one of these connections may be performed via the bump electrodes 16 and another connection may be performed via the bonding material 71.

Embodiment 3

In the above-mentioned embodiment 1, portions of source terminals 3a, 3b, and gate terminals 4a, 4b are projected from a side face of a resin sealing portion 6, and these terminals function as an external terminal. That is, the semiconductor device 1 of the above-mentioned embodiment 1 is a lead-type semiconductor package. The source terminals 3a, 3b, and the gate terminals 4a, 4b are not projected from the resin sealing portion 6 and hence, a semiconductor device 1d of this embodiment is a non-lead type (leadless type) semiconductor package.

Figure 28:
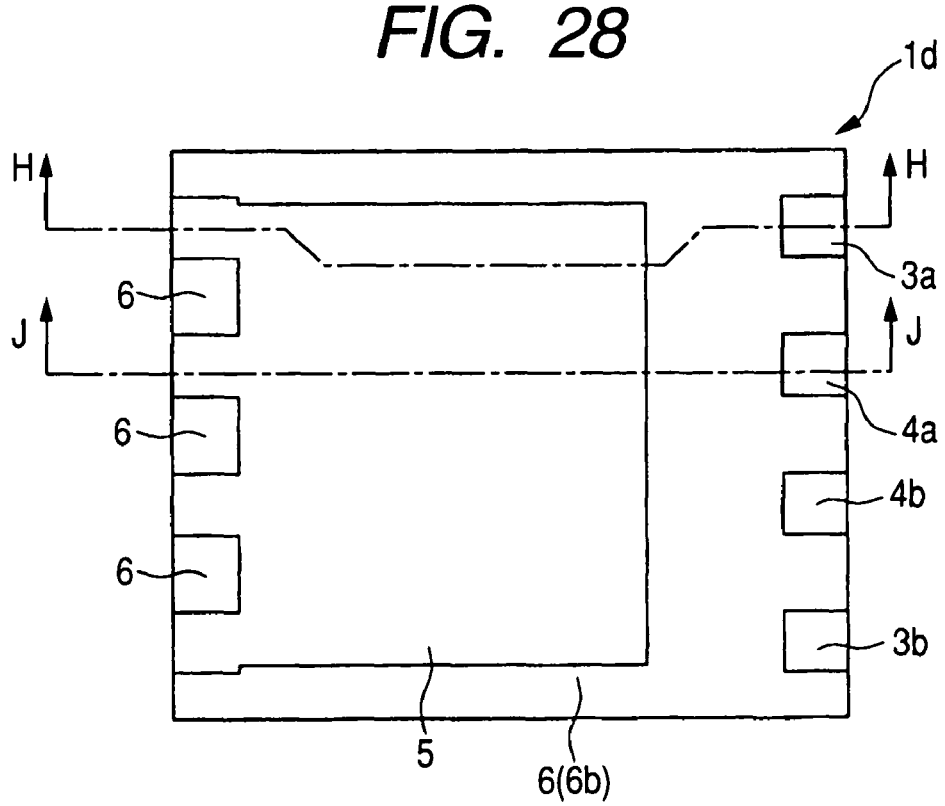
FIG. 28 is a bottom plan view of the semiconductor device according to the third embodiment of the present invention.
Figure 29:
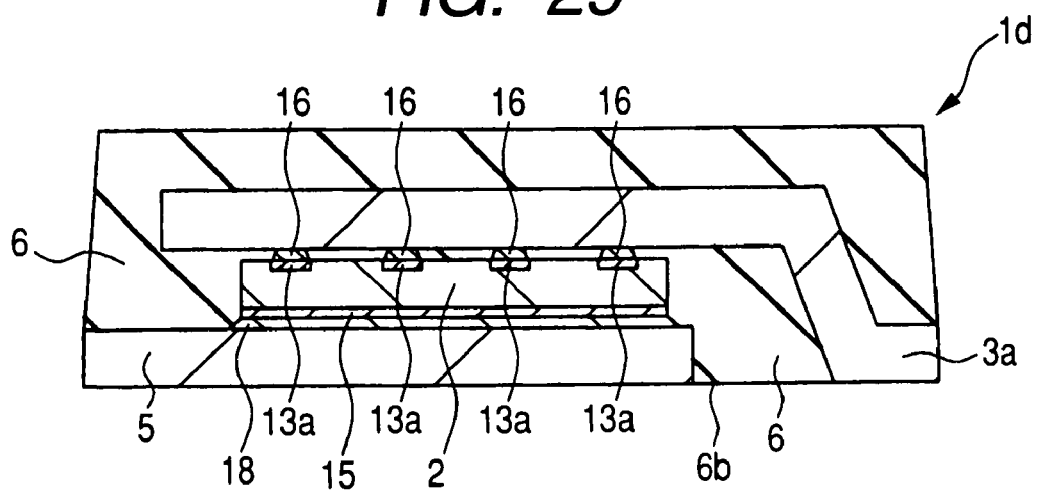
FIG. 29 is a cross-sectional view of the semiconductor device according to the third embodiment of the present invention.
Figure 30:
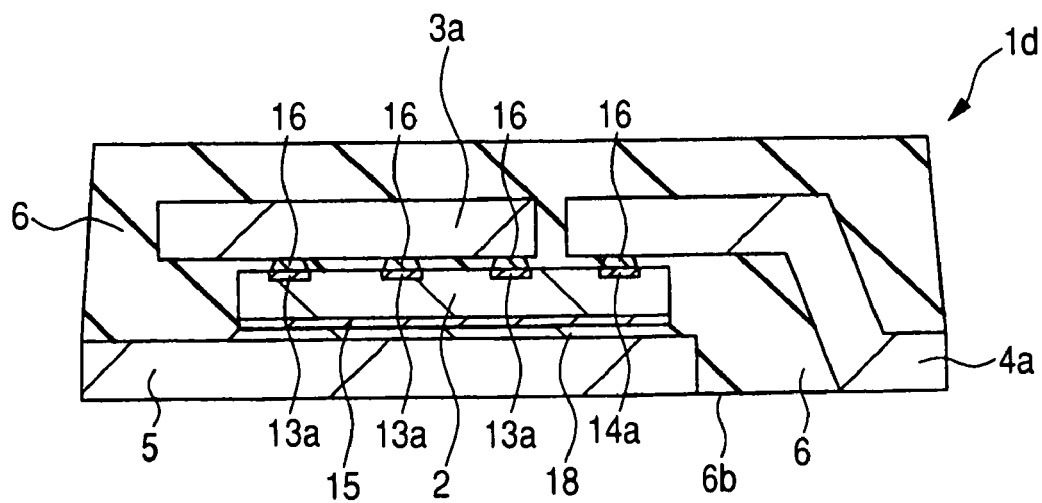
FIG. 30 is a cross-sectional view of the semiconductor device according to the third embodiment of the present invention.

FIG. 28 is a bottom plan view (back view) of the semiconductor device 1d of this embodiment, and FIG. 29 and FIG. 30 are cross-sectional views (cross-sectional side views) of the semiconductor device 1d. FIG. 28 to FIG. 30 correspond to FIG. 3, FIG. 6, and FIG. 7 of the above-mentioned embodiment 1, respectively. In addition, a cross section of the semiconductor device 1d at a position taken along a line H-H in FIG. 28 corresponds to FIG. 29, and a cross section of the semiconductor device 1d at a position taken along a line J-J in FIG. 28 corresponds to FIG. 30.

As shown in FIG. 28 to FIG. 30, in the semiconductor device 1d of this embodiment, the source terminals 3a, 3b, and the gate terminals 4a, 4b, and the drain terminal 5 are not projected from the resin sealing portion 6. The source terminals 3a, 3b, and the gate terminals 4a, 4b are bent in the resin sealing portion 6. Not only the drain terminal 5, but also portions of respective bottom surfaces of the source terminals 3a, 3b, and the gate terminals 4a, 4b are exposed on the back surface 6b of the resin sealing portion 6. Exposed surfaces of the source terminals 3a, 3b, the gate terminals 4a, 4b, and the drain terminal 5 on the back surface of the resin sealing portion 6 become external terminals (that is, terminal surfaces) of the semiconductor device 1d. When the semiconductor device 1d is mounted on the above-mentioned mounting substrate 51, for example, the terminal surfaces are bonded to a wiring pattern 52 via solder or the like thus establishing an electrical connection therebetween.

Here, since the other constitution of the semiconductor device 1d is substantially same as the semiconductor device 1 of the above-mentioned embodiment 1, the explanation thereof is omitted.

This embodiment may also obtain advantageous effects which are substantially equal to the advantageous effects of the above-mentioned embodiment 1. Further, in the semiconductor device 1d of this embodiment, since exposed surfaces of respective terminals 3a, 3b, 4a, and 4b on the back surface 6b of the resin sealing portion 6 become external terminals, a surface mounting of the semiconductor device 1d becomes possible.

Further, in this embodiment, as the above-mentioned embodiment 2, source electrodes 13a, 13b, and gate electrodes 14a, 14b of a semiconductor chip 2 can also be bonded to the source terminals 3a, 3b, and the gate terminals 4a, 4b via a conductive bonding material 71 thus establishing an electrical connection therebetween.

Embodiment 4

In an above-mentioned embodiment 1, a drain terminal 5 is exposed on a back surface 6b of the resin sealing portion 6. In a semiconductor device 1e of this embodiment, each terminal is not exposed on the back surface 6b of the resin sealing portion 6.

Figure 31:
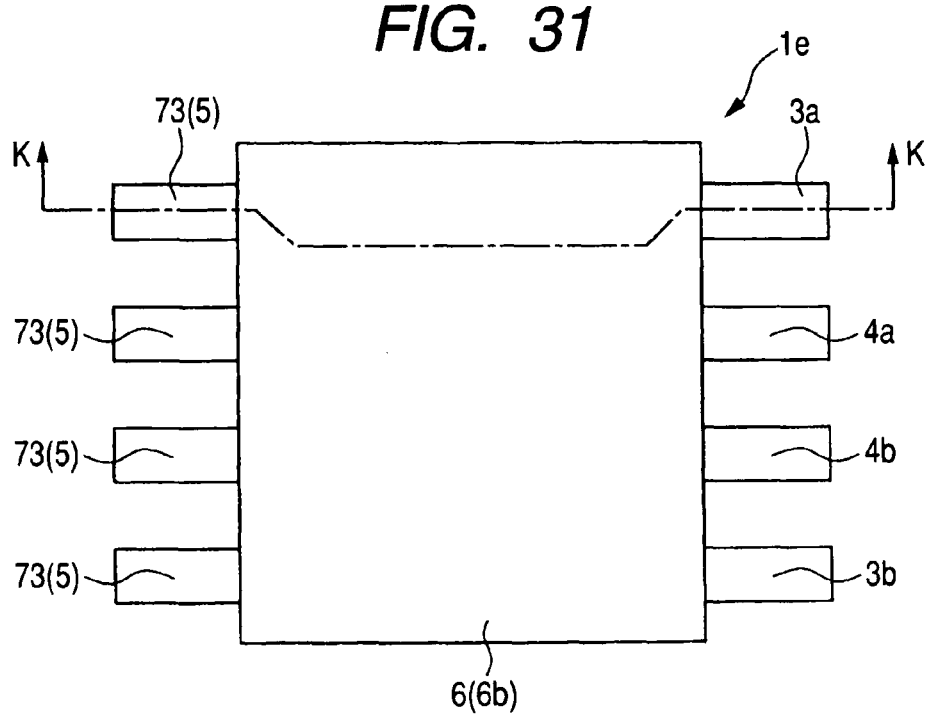
FIG. 31 is a bottom plan view of the semiconductor device according to the fourth embodiment of the present invention.
Figure 32:
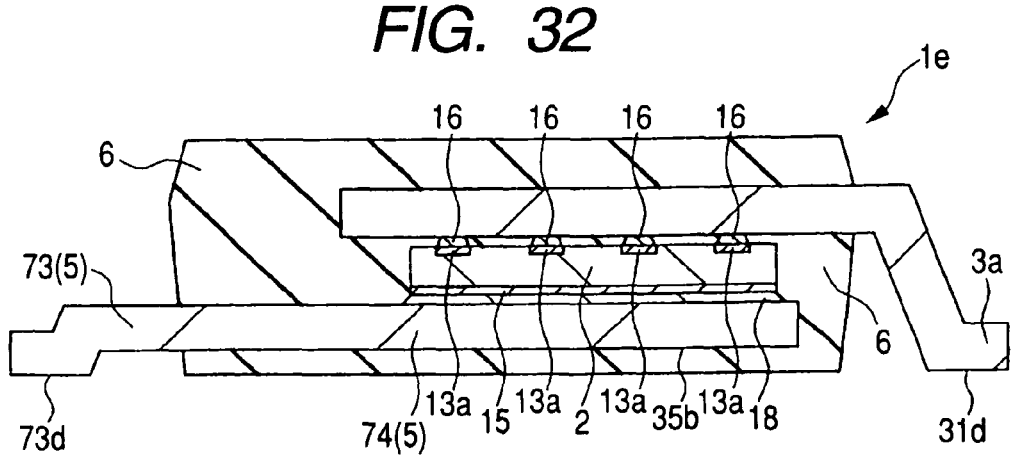
FIG. 32 is a cross-sectional view of the semiconductor device according to the fourth embodiment of the present invention.

FIG. 31 is a bottom plan view (back view) of the semiconductor device 1e of this embodiment, and FIG. 32 is a cross-sectional view (cross-sectional side view) of the semiconductor device 1e. FIG. 31 and FIG. 32 correspond to FIG. 3 and FIG. 6 of the above-mentioned embodiment 1, respectively. Further, across section of the semiconductor device 1e at a position taken along a line K-K in FIG. 31 corresponds to FIG. 32.

As shown in FIG. 31 and FIG. 32, in the semiconductor device 1e of this embodiment, the resin sealing portion 6 is formed to cover a lower surface 35b of a drain terminal 6. Accordingly, in the back surface 6b of the resin sealing portion 6, the drain terminal 5 is not exposed. That is, in the back surface 6b of the resin sealing portion 6, no terminals (source terminals 3a, 3b, and gate terminals 4a, 4b, and the drain terminal 5) are exposed.

In the semiconductor device 1e of this embodiment, a portion of the drain terminal 5 is projected from the resin sealing portion 6 in a state that the drain terminal 5 is bent. In FIG. 31, a plurality of portions 73 formed of a portion of the drain terminal 5 are projected from a side face of the resin sealing portion 6, at the same time, a plurality of the portions 73 are integrally connected with a common conductor portion 74 in the resin sealing portion 6. The portions 73 projected from the resin sealing portion 6 of the drain terminal 5 are bent in the same manner as the source terminals 3a, 3b, and the gate terminals 4a, 4b. Accordingly, with terminal surfaces 31d, 32d, 33d, and 34d of the source terminals 3a, 3b, and the gate terminals 4a, 4b, lower surfaces (terminal surfaces) 73d of the portions which are projected from the resin sealing portion 6 of the drain terminal 5 and are bent become terminal surfaces as a external terminal.

Here, since the other constitution of the semiconductor device 1e is substantially same as the semiconductor device 1 of the above-mentioned embodiment 1, the explanation thereof is omitted.

This embodiment may also obtain advantageous effects substantially equal to the advantageous effects of the above-mentioned embodiment 1.

Further, also in the same manner as the embodiment 2, as the above-mentioned embodiment 2, source electrodes 13a, 13b, and gate electrodes 14a, 14b of a semiconductor chip 2 may be bonded to the source terminals 3a, 3b, and the gate terminals 4a, 4b via a conductive bonding material 71 thus establishing an electrical connection therebetween.

Embodiment 5

Figure 6:
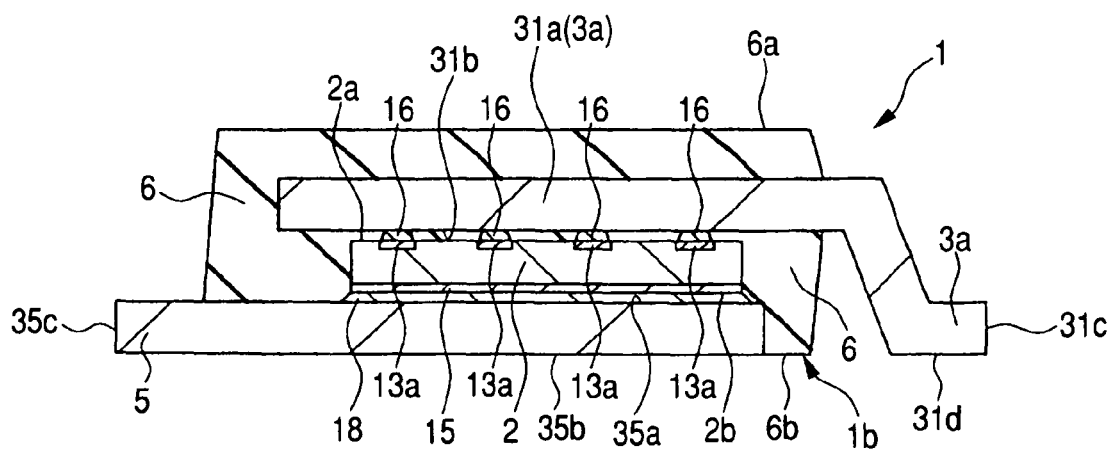
FIG. 6 is a cross-sectional view showing the semiconductor device according to the first embodiment of the present invention.
Figure 7:
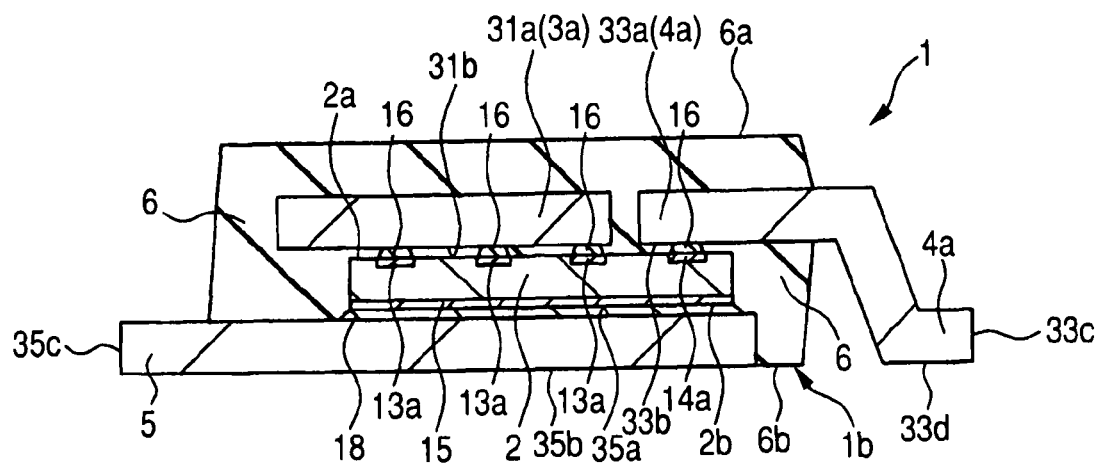
FIG. 7 is a cross-sectional view showing the semiconductor device according to the first embodiment of the present invention.
Figure 8:
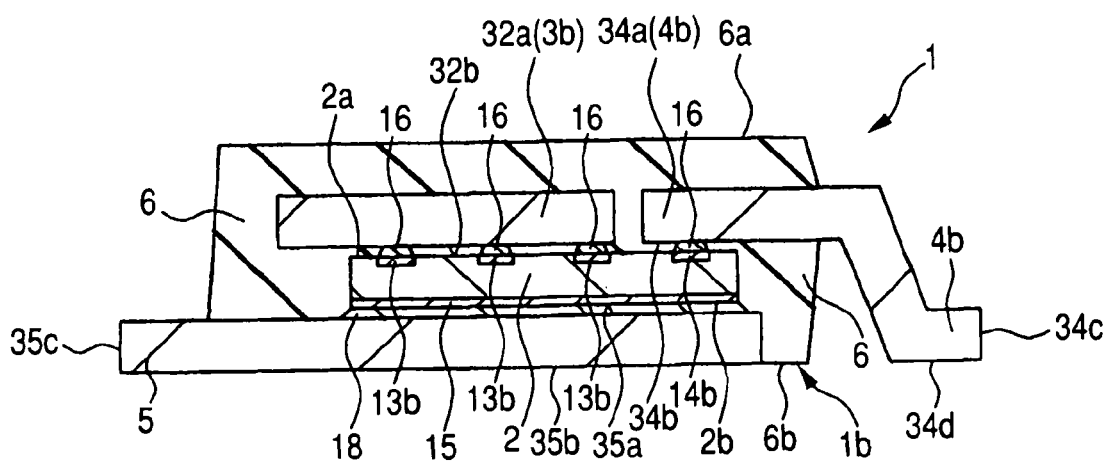
FIG. 8 is a cross-sectional view showing the semiconductor device according to the first embodiment of the present invention.
Figure 9:
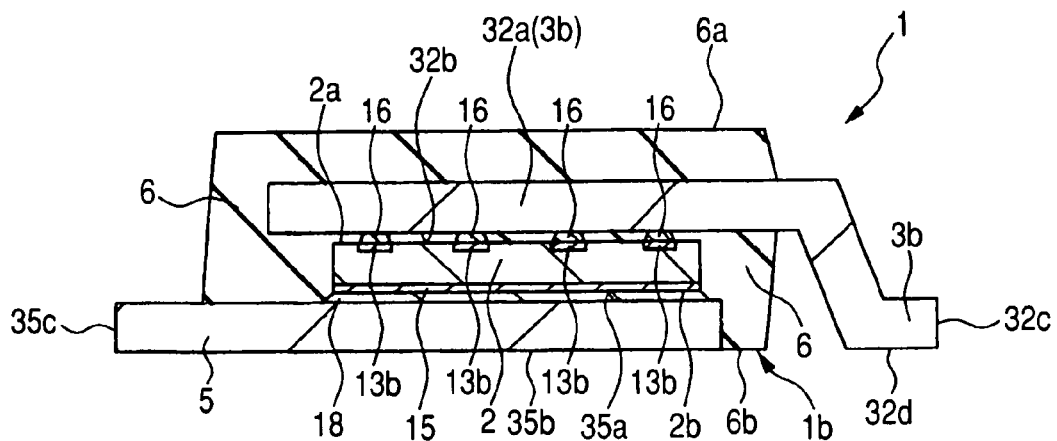
FIG. 9 is a cross-sectional view showing the semiconductor device according to the first embodiment of the present invention.
Figure 33:
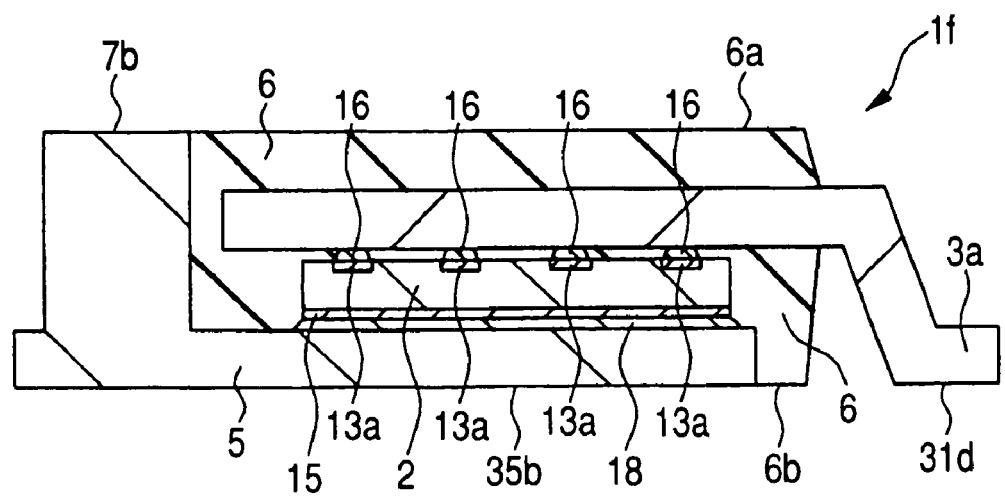
FIG. 33 is a cross-sectional view of the semiconductor device according to the fifth embodiment of the present invention.

FIG. 33 is a cross-sectional view (a cross-sectional side view) of a semiconductor device 1f of this embodiment, and corresponds to FIG. 6 of the above-mentioned embodiment 1.

In the above-mentioned embodiment 1, although the drain terminal 5 is exposed on the back surface 6b of the resin sealing portion 6, the drain terminal 5 is not exposed on the top surface 6a of the resin sealing portion 6. As shown in FIG. 33, in the semiconductor device 1f of this embodiment (the lower surface 35b and a portion of the top surface 76 of the drain terminal 5 is exposed on both surfaces of the back surface and the top surface 6a of the resin sealing portion 6.

Here, since the other constitution of the semiconductor device 1f is substantially same as the semiconductor device 1 of the above-mentioned embodiment 1, the explanation thereof is omitted.

This embodiment may also obtain advantageous effects substantially equal to the advantageous effects of the above-mentioned embodiment 1. Further, in this embodiment, since the drain terminal 5 is exposed on both surfaces of the back surface 6b and top surface 6a of the resin sealing portion 6, the heat radiation property of the semiconductor device 1f may be further enhanced.

Further, in this embodiment, as the above-mentioned embodiment 2, the source electrodes 13a, 13b, and the gate electrodes 14a, 14b of the semiconductor chip 2 may be also bonded to the source terminals 3a, 3b and the gate terminals 4a, 4b via a conductive bonding material 71 thus establishing an electric connection therebetween.

Embodiment 6

Figure 34:
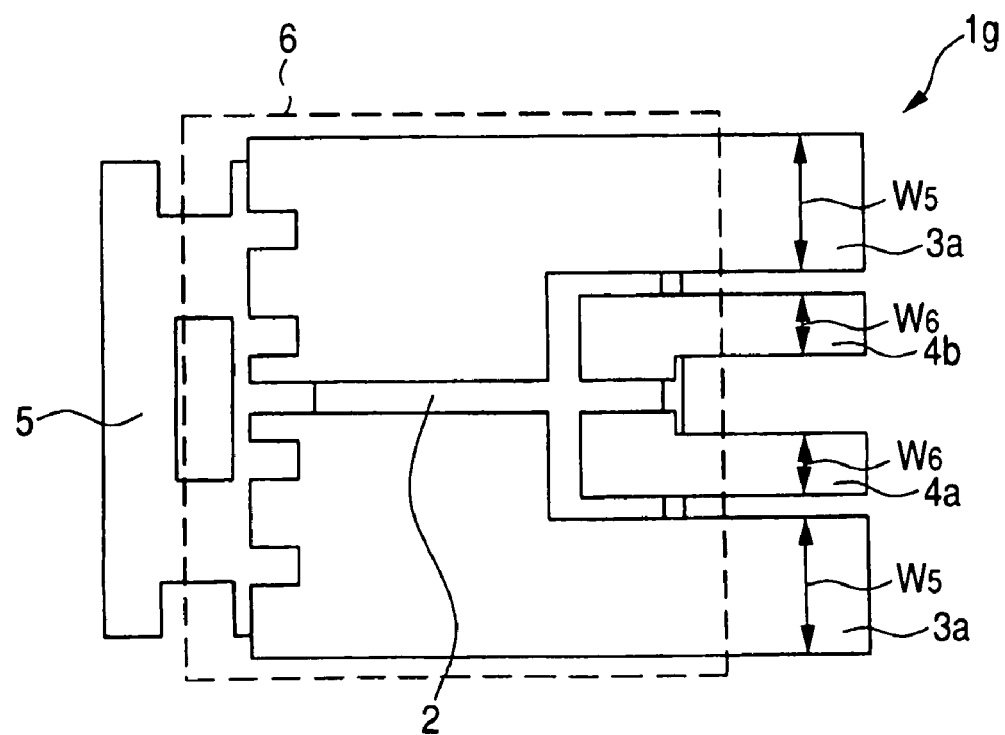
FIG. 34 is a perspective plan view of the semiconductor device according to the sixth embodiment of the present invention.

FIG. 34 is a perspective plan view of a semiconductor device 1g of this embodiment, and corresponds to FIG. 4 of the above-mentioned embodiment 1, and a top plan view of the semiconductor device 1g when the resin sealing portion 6 as viewed in a see-through manner is shown.

In the semiconductor device 1g of this embodiment, a size (width) $W_5$ of the source terminals 3a, 3b which project from the resin sealing portion 6 is set larger than a size (width) $W_6$ of the gate terminals 4a, 4b which project from the resin sealing portion 6 ($W_5 > W_6$).

Here, since other constitutions of the semiconductor device 1e are substantially equal to the corresponding constitutions of the semiconductor device 1 of the above-mentioned embodiment 1, the explanation thereof is omitted.

This embodiment also may obtain advantageous effects substantially equal to the advantageous effects of the above-mentioned embodiment 1. Further, since the size (width) $W_5$ of portions of the source terminals 3a, 3b which project from the resin sealing portion 6 is set larger than the size (width) $W_6$ of portions of the gate terminals 4a, 4b which project from the resin sealing portion 6, the source resistance may be further reduced. Accordingly, it is possible to advantageously reduce the ON resistance of the semiconductor device.

Further, also in this embodiment, as the above-mentioned embodiment 2, the source electrodes 13a, 13b, and the gate electrodes 14a, 14b of the semiconductor chip 2 may be also bonded to the source terminal 3a, 3b, and the gate terminal 4a, 4b via a conductive bonding material 71 thus establishing an electrical connection therebetween.

Further, this embodiment may be also applied to the above-mentioned embodiments 3 to 5.

Embodiment 6

Figure 35:
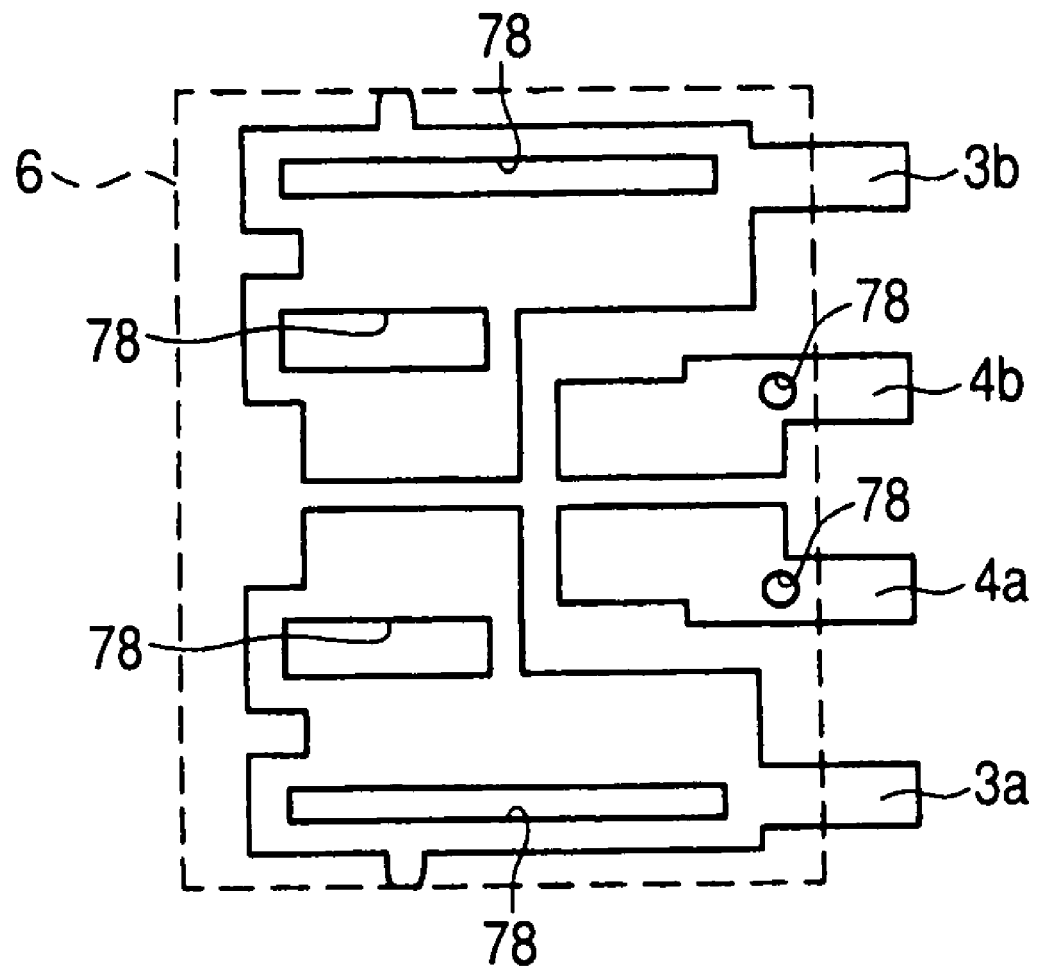
FIG. 35 is a plan view of the semiconductor device according to the seventh embodiment of the present invention.
Figure 36:
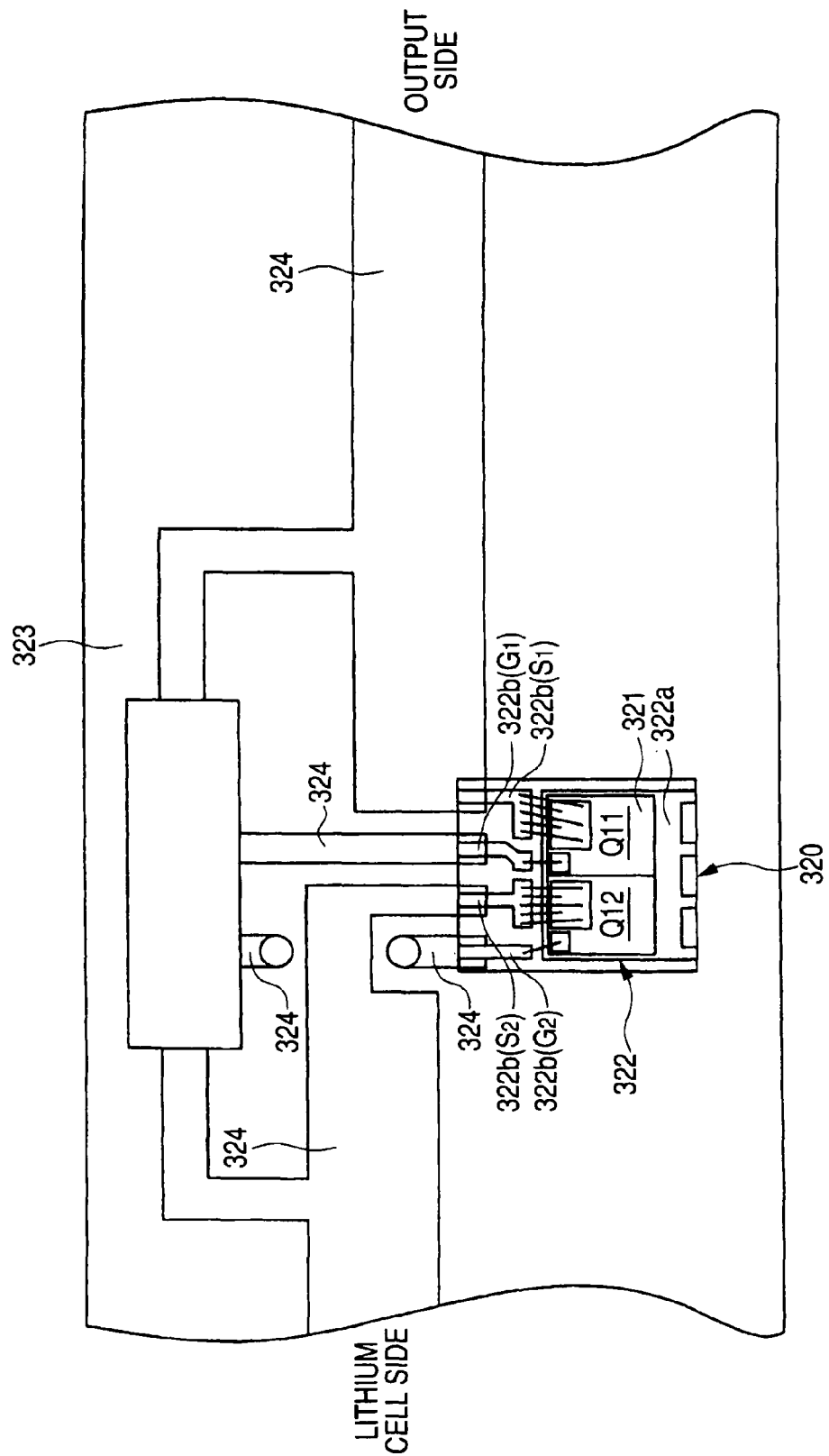
FIG. 36 is a plan view of an essential part of a $Li^+$ battery protective circuit formed by mounting a semiconductor device according to a comparison example on a mounting substrate.

FIG. 35 is a plan view of a semiconductor device of this embodiment, but constitutional features except for the source electrodes 13a, 13b and gate electrodes 14a, 14b are omitted from the drawings and a forming region of the resin sealing portion 6 is shown by using dotted lines.

In this embodiment, in a region of the source terminals 3a, 3b, and the gate terminals 4a, 4b within the resin sealing portion, an opening portion (resin lock opening portion) 78 is provided, and the resin sealing portion 6 is also applied to the inside of this opening portion 78. Accordingly, after forming the resin sealing portion 6, the source terminals 3a, 3b, and the gate terminals 4a, 4b are hardly removed from the resin sealing portion 6. Accordingly, a reliability of a semiconductor device may be enhanced. Further, in place of or in addition to the opening portion 78, a non-through-type resin lock such as a V-shaped groove or the like may be provided.

This embodiment may be applicable to the above-mentioned embodiments 1 to 6.

Although the present invention has been specifically explained in conjunction with the embodiments, it is needless to say that the present invention is not limited to the above-mentioned embodiments and various modifications are conceivable without departing from the gist of the present invention.

The present invention is preferably applicable to a semiconductor device which includes a field effect transistor as a switch element for charging and discharging a battery.

What is claimed is:

1. A semiconductor device comprising:
   a semiconductor substrate;
   first and second field effect transistors which are formed over a main surface of the semiconductor substrate;
   a first source electrode and a first gate electrode which are respectively electrically connected with a source and a gate of the first field effect transistor and are formed over the main surface of the semiconductor substrate;
   a second source electrode and a second gate electrode which are respectively electrically connected with a source and a gate of the second field effect transistor and are formed over the main surface of the semiconductor substrate;
   a drain electrode which is electrically connected with drains of the first and second field effect transistors and is formed over a back surface of the semiconductor substrate;
   a plurality of first source bump electrodes disposed over the first source electrode;
   a first gate bump electrode disposed over the first gate electrode;
   a plurality of second source bump electrodes disposed over the second source electrode;
   a second gate bump electrode disposed over the second gate electrode;
   a first source conductor portion which is electrically connected with the first source electrodes via the plurality of first source bump electrodes, formed over the semiconductor substrate;
   a first gate conductor portion which is electrically connected with the first gate electrodes via the first gate bump electrode, formed over the semiconductor substrate;
   a second source conductor portion which is electrically connected with the second source electrodes via the plurality of second source bump electrodes, formed over the semiconductor substrate;
   a second gate conductor portion which is electrically connected with the second gate electrodes via the second gate bump electrode, formed over the semiconductor substrate;
   a drain conductor portion which is electrically connected with the drain electrode formed over the back surface of the semiconductor substrate, and
   a sealing portion which covers the first and second source conductor portions, the first and second gate conductor portions, a portion of the drain conductor portion and the semiconductor substrate, wherein respective portions of the first and second source conductor portions, the first and second gate conductor portions and the drain conductor portion are exposed from the sealing portion, wherein an exposed portion of the first source conductor portion, an exposed portion of the first gate conductor portion, an exposed portion of the second gate conductor portion and an exposed portion of the second source conductor portion from the sealing portion are arranged in order in one direction, wherein the first and second source conductor portions and the first and second gate conductor portions have other portions thereof extended over the main surface of the semiconductor substrate, wherein a portion of the first source electrode which extends over the main surface of the semiconductor substrate is also present in a first extending direction that the first gate conductor portion extends from a portion thereof which is exposed from the sealing portion to a portion thereof in the inside of the sealing portion, wherein a portion of the first source conductor portion which extends over the main surface of the semiconductor substrate is also present in the first extending direction that the first gate conductor portion extends from a portion thereof which is exposed from the sealing portion to a portion thereof in the inside of the sealing portion, wherein a portion of the second source electrode which extends over the main surface of the semiconductor substrate is also present in a second extending direction that the second gate conductor portion extends from a portion thereof which is exposed from the sealing portion to a portion thereof in the inside of the sealing portion, wherein a portion of the second source conductor portion which extends over the main surface of the semiconductor substrate is also present in the second extending direction that the second gate conductor portion extends from a portion thereof which is exposed from the sealing portion to a portion thereof in the inside of the sealing portion, wherein, in the first extending direction, one of the plurality of the first source bump electrodes is present between the first gate bump electrode and another one of the plurality of the first source bump electrodes, and wherein, in the second extending direction, one of the plurality of the second source bump electrodes is present between the second gate bump electrode and another one of the plurality of the second source bump electrodes.

2. The semiconductor device according to claim 1, wherein the first source conductor portion and the second source conductor portion have a planar symmetrical relationship with respect to a line which passes between the first gate conductor portion and the second gate conductor portion.

3. The semiconductor device according to claim 1, wherein the first and second source conductor portions and the first and second gate conductor portions are formed of a lead frame.

4. The semiconductor device according to claim 1, wherein the first and second source conductor portions and the first and second gate conductor portions are formed of a conductor mainly comprised of copper.

5. The semiconductor device according to claim 1,
wherein the first source electrodes arranged over the semiconductor substrate and the first source conductor portion extending over the first source electrode are connected with each other in the extending direction that the first gate conductor portion extends from a portion thereof which is exposed from the sealing portion to a portion thereof in the inside of the sealing portion, and wherein the second source electrodes arranged over the semiconductor substrate and the second source conductor portion extending over the second source electrode are connected with each other in the extending direction that the second gate conductor portion extends from a portion thereof which is exposed from the sealing portion to a portion thereof in the inside of the sealing portion.

6. The semiconductor device according to claim 1,
wherein the bump electrodes which connect the first source electrode and the first source conductor portion over the semiconductor substrate with each other are arranged in plural rows over the main surface of the semiconductor substrate, wherein the bump electrodes which connect the second source electrodes and the second source conductor portion over the semiconductor substrate with each other are arranged in plural rows over the main surface of the semiconductor substrate.

7. The semiconductor device according to claim 6,
wherein portions of the bump electrodes which connect the first source electrodes and the first source conductor portion over the semiconductor substrate with each other and the bump electrodes which connect the first gate electrodes and the first gate conductor portion over the semiconductor substrate with each other are arranged over the same row, and wherein portions of the bump electrodes which connect the second source electrodes and the second source conductor portion over the semiconductor substrate with each other and the bump electrodes which connect the second gate electrodes and the second gate conductor portion over the semiconductor substrate with each other are arranged over the same row.

8. The semiconductor device according to claim 1, wherein the bump electrodes which respectively connect the first and second source electrodes with the first and second source conductor portions are arranged in a spaced-apart manner in a substantially whole region of the main surface of the semiconductor device except for regions over which the first and second gate electrodes are arranged and the vicinities of the regions.

9. The semiconductor device according to claim 1, wherein the first source electrodes, the first gate electrodes, the second source electrodes and the second gate electrodes over the semiconductor substrate are respectively connected with the portions of the first source conductor portion, the first gate conductor portion, the second source conductor portion and the second gate conductor portion which extend over the semiconductor substrate via a conductive bonding material.

10. The semiconductor device according to claim 9, wherein the first and second source electrodes are formed in a substantially whole region of the main surface of the semiconductor device except for regions where the first and second gate electrodes are arranged and the vicinities thereof, and the first and second source electrodes are respectively connected with the first and second source conductor portions via the bonding material.

11. The semiconductor device according to claim 1, wherein the sealing portion is a resin sealing portion which contains a resin material.

12. The semiconductor device according to claim 1, wherein the first and second field effect transistors are respectively formed of a vertical-type or horizontal-type power metal insulator semiconductor field effect transistor which includes a trench-type gate structure or a planar-type gate structure.

13. The semiconductor device according to claim 1, wherein the semiconductor device is used as a switching element for charging/discharging a battery.

14. The semiconductor device according to claim 1, wherein the exposed portion of the first source conductor portion, the exposed portion of the first gate conductor portion, the exposed portion of the second gate conductor portion, the exposed portion of the second source conductor portion, and the exposed portion of the drain conductor portion which are respectively exposed from the sealing portion function as external terminals of the semiconductor device.

15. The semiconductor device according to claim 1,
wherein the semiconductor device is capable of being mounted over a printed wiring board which includes a plurality of lines, and
wherein the exposed portion of the first source conductor portion, the exposed portion of the first gate conductor portion, the exposed portion of the second gate conductor portion and the exposed portion of the second source conductor portion which are respectively exposed from the sealing portion are capable of being respectively and electrically connected with the lines of the printed wiring board.

16. The semiconductor device according to claim 15, wherein the exposed portion of the first source conductor portion, the exposed portion of the first gate conductor portion, the exposed portion of the second gate conductor portion and the exposed portion of the second source conductor portion which are respectively exposed from the sealing portion are capable of being connected with the lines of the printed wiring board via solder.

17. The semiconductor device according to claim 15, wherein a width of the lines of the printed wiring board which are connected with the exposed portions of the first and second source conductor portions from the sealing portion is set larger than a width of the lines of the printed wiring board which are connected with the exposed portions of the first and second gate conductor portions from the sealing portion.

* * * * *